US012696511B2

(12) United States Patent (10) Patent No.: US 12,696,511 B2
Chen et al. (45) Date of Patent: Jul. 28, 2026

(54) VOLUME-LESS FLUORINE INCORPORATION METHOD

(71) Applicant: Taiwan Semiconductor Manufacturing Co., Ltd., Hsinchu (TW)

(72) Inventors: Hsueh-Ju Chen, Taipei City (TW); Chi On Chui, Hsinchu (TW); Tsung-Da Lin, Hsinchu (TW); Pei Ying Lai, Hsinchu (TW); Chia-Wei Hsu, Taipei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 524 days.

(21) Appl. No.: 18/150,861

(22) Filed: Jan. 6, 2023

(65) Prior Publication Data

US 2024/0071767 A1 Feb. 29, 2024

Related U.S. Application Data

(60) Provisional application No. 63/382,021, filed on Nov. 2, 2022, provisional application No. 63/373,405, filed on Aug. 24, 2022.

(51) Int. Cl.
H01L 21/00 (2006.01)
H01L 21/02 (2006.01)
(Continued)

(52) U.S. Cl.
CPC .... H01L 21/28158 (2013.01); H01L 21/0206 (2013.01); H01L 21/02321 (2013.01);
(Continued)

(58) Field of Classification Search
CPC ............. H10D 30/6735; H10D 62/121; H10D 64/017; H01L 21/3115; H01L 21/02337; H01L 21/02321
See application file for complete search history.

(56) References Cited

U.S. PATENT DOCUMENTS 10,847,637 B2 11/2020 Chiu et al.
11,404,554 B2 8/2022 Lee et al.
(Continued)

FOREIGN PATENT DOCUMENTS

KR 20190013403 A 2/2019
KR 20190037507 A 4/2019
(Continued)

OTHER PUBLICATIONS

Remi Vallat et al., "Area selective deposition of TiO2 by intercalation of plasma etching cycles in PEALD process: A bottom up approach for the simplification of 3D integration scheme," Journal of Vacuum Science & Technology A, vol. 37, Feb. 4, 2019, 13 pages.

(Continued)

*Primary Examiner* — Reema Patel
(74) *Attorney, Agent, or Firm* — Slater Matsil, LLP

(57) ABSTRACT

A method includes removing a dummy gate stack to form a trench between gate spacers, depositing a gate dielectric extending into the trench, and performing a first treatment process on the gate dielectric. The first treatment process is performed using a fluorine-containing gas. A first drive-in process is then performed to drive fluorine in the fluorine-containing gas into the gate dielectric. The method further includes performing a second treatment process on the gate dielectric, wherein the second treatment process is performed using the fluorine-containing gas, and performing a second drive-in process to drive fluorine in the fluorine-containing gas into the gate dielectric. After the second (Continued)

drive-in process, conductive layers are formed to fill the trench.

20 Claims, 30 Drawing Sheets

(51) Int. Cl.
| | | |
|---|---|---|
| *H01L 21/28* | (2006.01) | |
| *H10D 30/01* | (2025.01) | |
| *H10D 64/01* | (2025.01) | |
| *H10D 30/67* | (2025.01) | |
| *H10D 62/10* | (2025.01) | |

(52) U.S. Cl.
CPC ..... *H01L 21/02337* (2013.01); *H10D 30/014* (2025.01); *H10D 64/01* (2025.01); *H10D 30/6735* (2025.01); *H10D 62/121* (2025.01)

(56) References Cited

U.S. PATENT DOCUMENTS

| | | | |
|---|---|---|---|
| 11,515,162 | B2 | 11/2022 | More et al. |
| 11,670,553 | B2 | 6/2023 | Savant et al. |
| 11,670,676 | B2 | 6/2023 | Min et al. |
| 12,354,876 | B2 | 7/2025 | Wei et al. |
| 2019/0096681 | A1* | 3/2019 | Wei .................. H01L 21/32134 |
| 2020/0411667 | A1 | 12/2020 | Wong et al. |
| 2021/0287905 | A1 | 9/2021 | Wei et al. |
| 2024/0371963 | A1 | 11/2024 | Lee et al. |
| 2025/0248094 | A1 | 7/2025 | Lee et al. |

FOREIGN PATENT DOCUMENTS

| | | | |
|---|---|---|---|
| KR | 20200035837 | A | 4/2020 |
| KR | 20210141300 | A | 11/2021 |
| KR | 20220022085 | A | 2/2022 |
| KR | 20220106647 | A | 7/2022 |
| TW | 202211308 | A | 3/2022 |
| TW | 202230806 | A | 8/2022 |

OTHER PUBLICATIONS

Wikipedia-Aartikel: Nitrogen trifluoride. 2022. URL: https://en. wikipedia. org/wiki/Nitrogen_trifluoride, Archiviert in https://web. archive.org am Aug. 2, 2022 [abgerufen am Feb. 5, 2025].

* cited by examiner

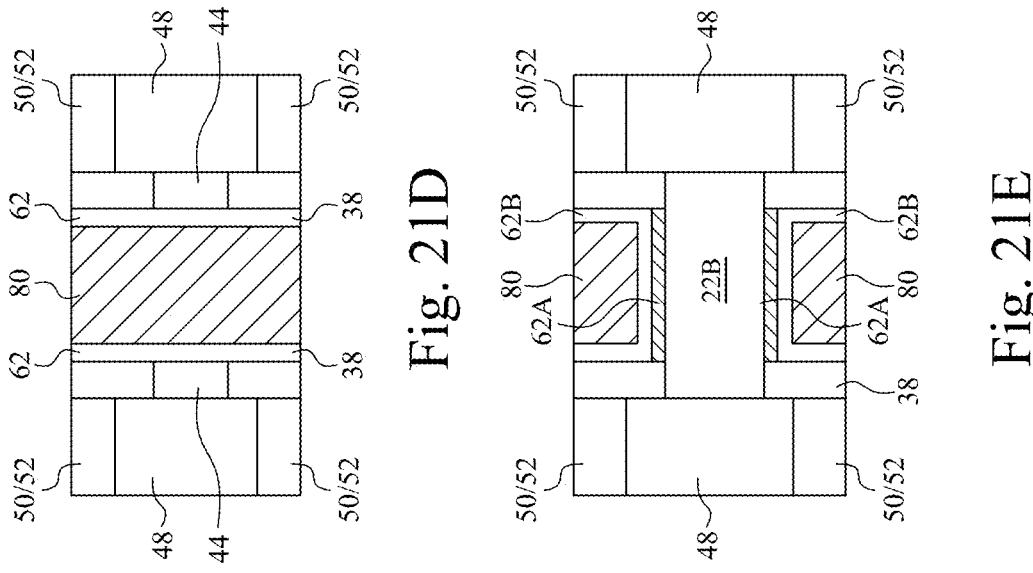
Fig. 21D
Fig. 21E
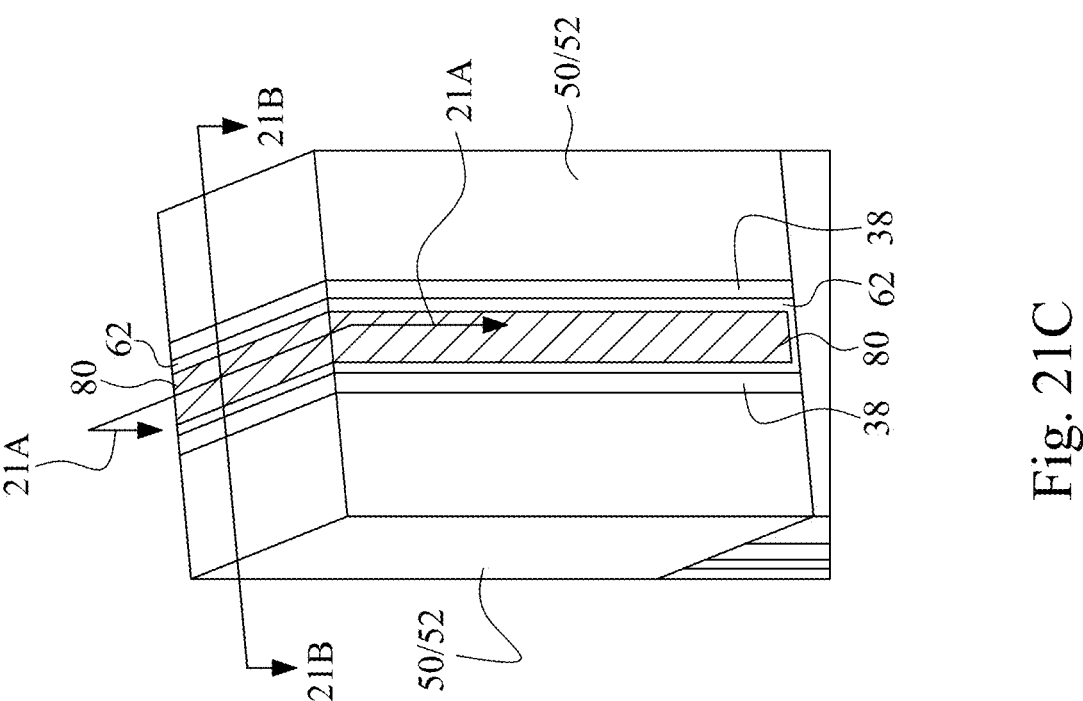
Fig. 21C

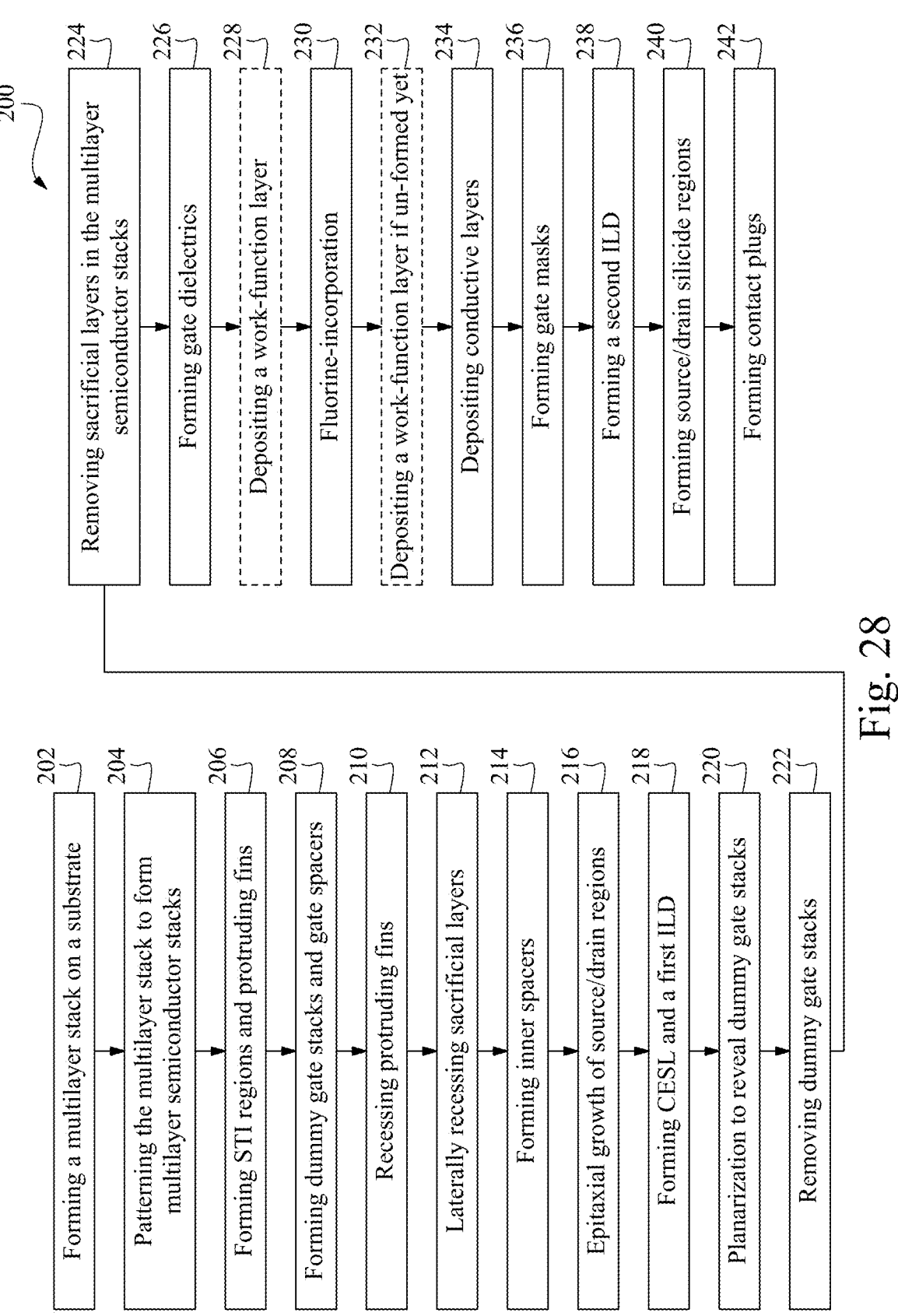

200

224 — Removing sacrificial layers in the multilayer semiconductor stacks

226 — Forming gate dielectrics

228 — Depositing a work-function layer

230 — Fluorine-incorporation

232 — Depositing a work-function layer if un-formed yet

234 — Depositing conductive layers

236 — Forming gate masks

238 — Forming a second ILD

240 — Forming source/drain silicide regions

242 — Forming contact plugs

202 — Forming a multilayer stack on a substrate

204 — Patterning the multilayer stack to form multilayer semiconductor stacks

206 — Forming STI regions and protruding fins

208 — Forming dummy gate stacks and gate spacers

210 — Recessing protruding fins

212 — Laterally recessing sacrificial layers

214 — Forming inner spacers

216 — Epitaxial growth of source/drain regions

218 — Forming CESL and a first ILD

220 — Planarization to reveal dummy gate stacks

222 — Removing dummy gate stacks

Fig. 28

VOLUME-LESS FLUORINE INCORPORATION METHOD

PRIORITY CLAIM AND CROSS-REFERENCE

This application claims the benefit of the following provisionally filed U.S. Patent application: Application No. 63/382,021, filed on Nov. 2, 2022, and entitled "Volume-Less Fluorine Incorporation Method," and Application No. 63/373,405, filed on Aug. 24, 2022, and entitled "Volume-Less Fluorine Incorporation Method," which applications is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given chip area. As the minimum feature sizes are reduced, however, additional problems and requirements arise and are addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14-18, 19A, 19B, 20A, 20B, 21A, 21B, 21C, 21D and 21E illustrate the intermediate stages in the formation of a Gate All-Around (GAA) transistor in accordance with some embodiments.

FIG. 28 illustrates a process flow for forming a GAA transistor in accordance with some embodiments.

DETAILED DESCRIPTION

Figure 1:
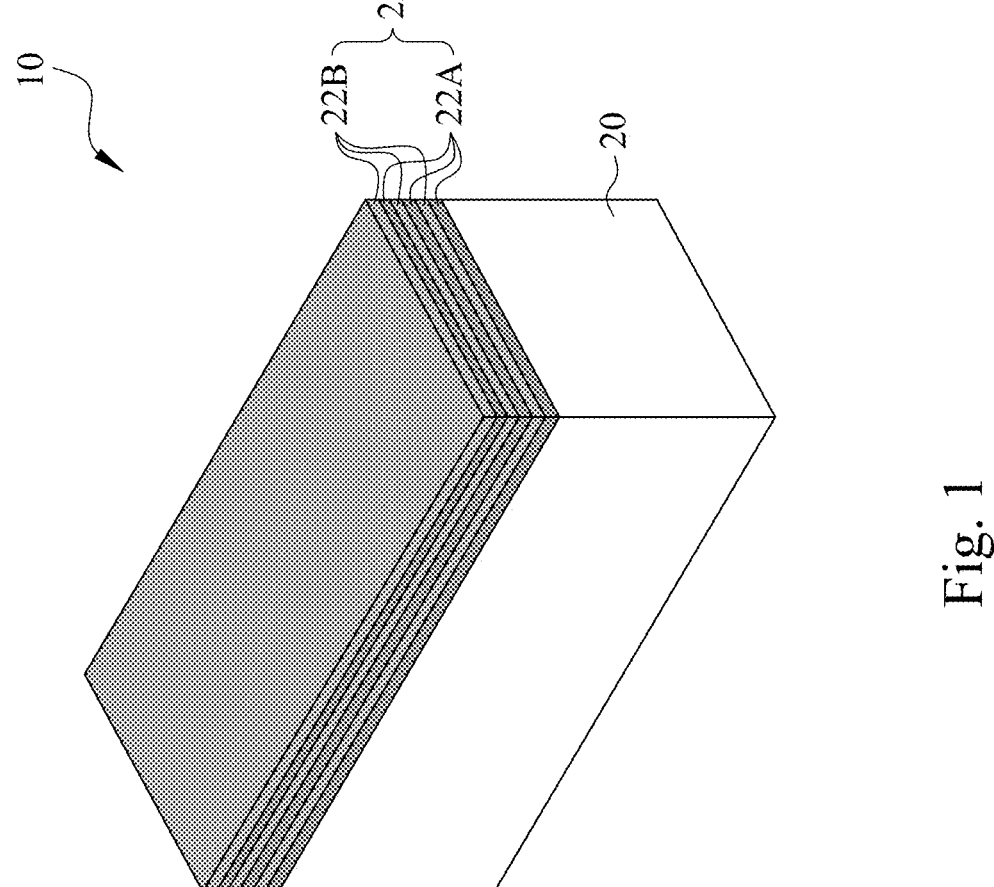

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Methods of incorporating fluorine into a gate dielectric in a transistor are provided. In accordance with some embodiments, nanostructures are formed. A plurality of gate dielectrics comprising a plurality of high-k dielectric layers are formed on the nanostructures. A fluorine-incorporation process is performed to incorporate fluorine into the high-k dielectric layers, so that the high-k dielectric layers may be passivated, and the defects therein may be repaired. The fluorine-incorporation process may include removal processes, so that the fluorine-incorporation process does not result in additional layers to be formed in the gaps between the nanostructures. The subsequent filling of the gaps with conductive layers can thus be performed without difficulty.

In the description of the present disclosure, Gate All-Around (GAA) transistors are discussed to explain the concept of the present disclosure. The embodiments of the present disclosure may also be applied to other types of transistors such as planar transistors, Fin Field-Effect Transistors (FinFETs), and the like. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 10A, 10B, 10C, 11A, 11B, 12A, 12B, 13A, 13B, 14-18, 19A, 19B, 20A, 20B, 21A, 21B, 21C, 21D and 21E illustrate various views of intermediate stages in the formation of a GAA transistor in accordance with some embodiments of the present disclosure. The corresponding processes are also reflected schematically in the process flow 200 as shown in FIG. 28.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 28. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
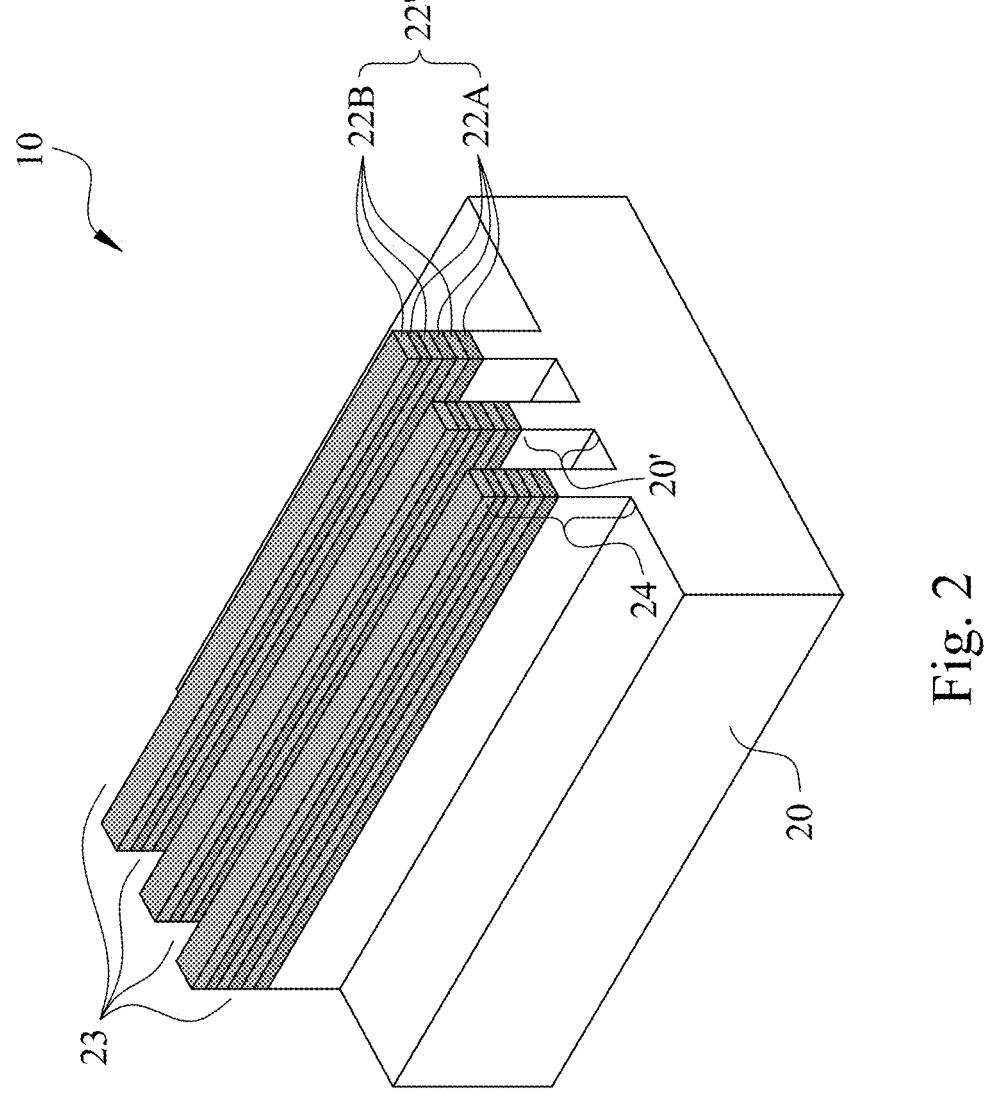

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 28. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
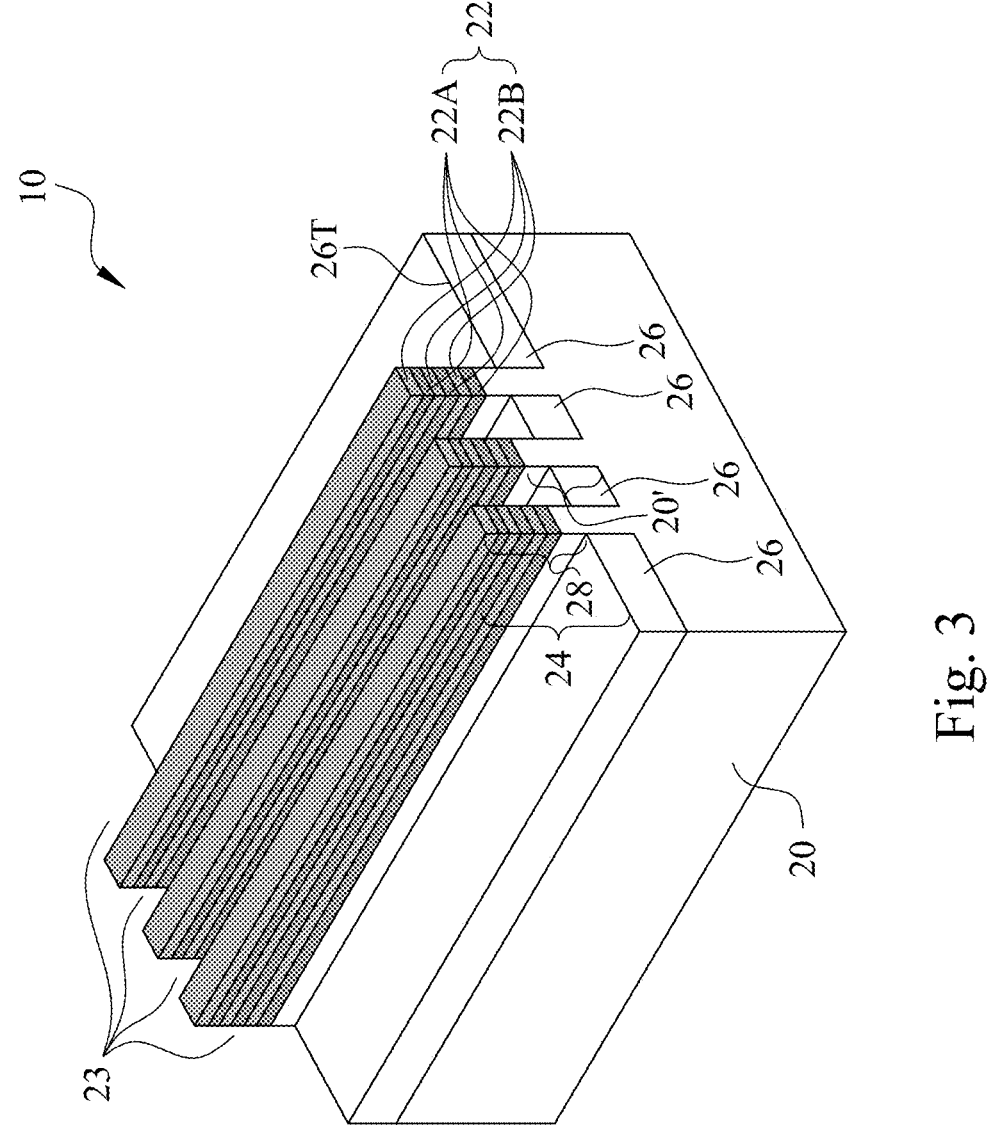

FIG. 3 illustrates the formation of isolation regions 26, which are also referred to as Shallow Trench Isolation (STI) regions throughout the description. The respective process is illustrated as process 206 in the process flow 200 shown in FIG. 28. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
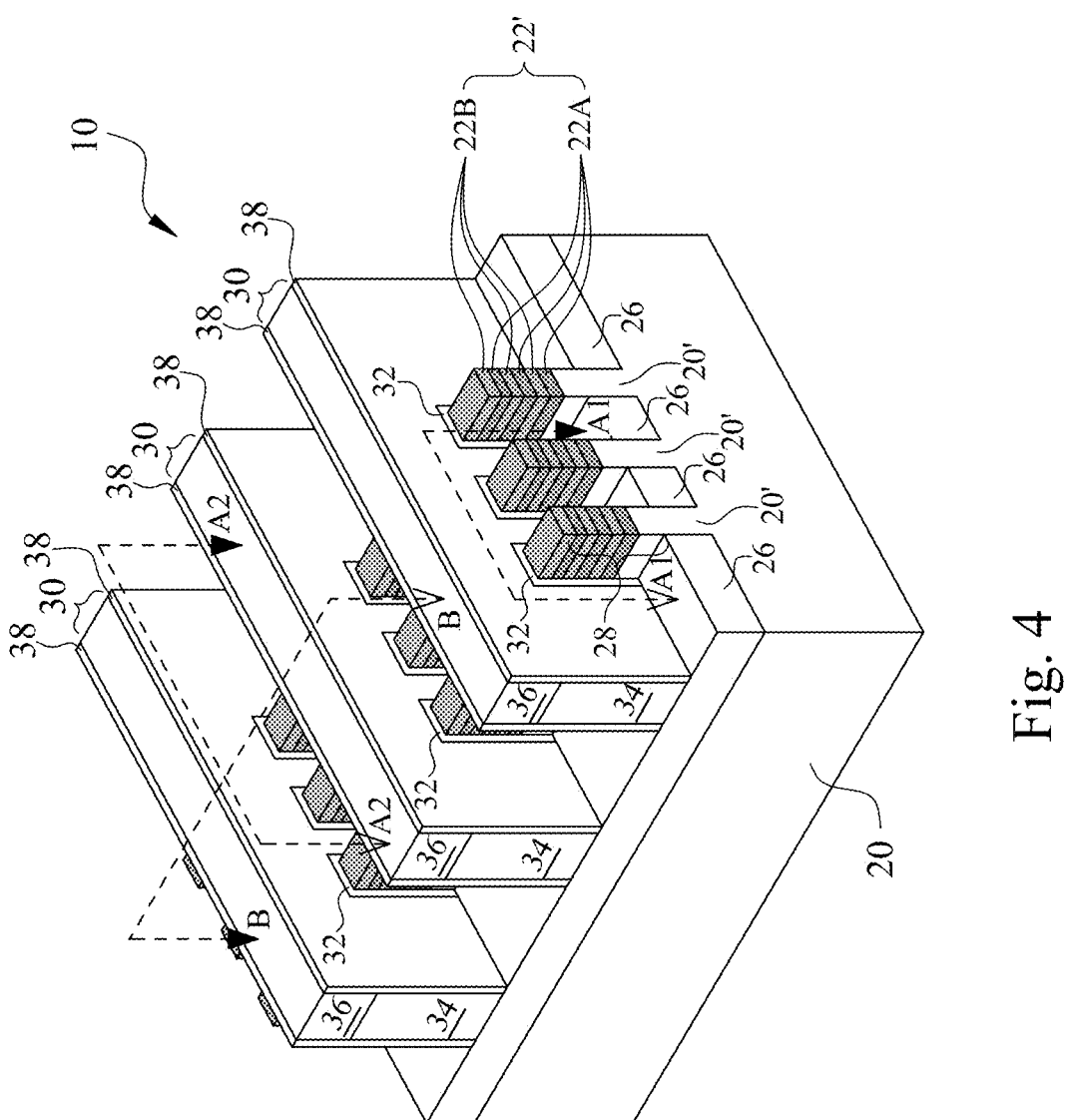

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 28. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used.

Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a pattering process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
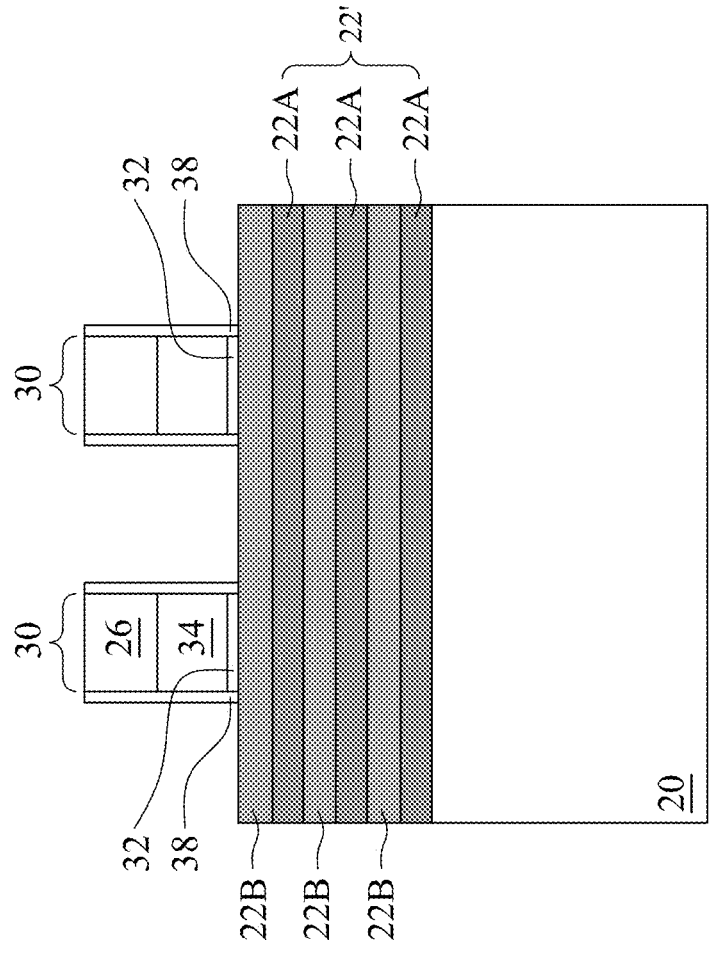
Figure 5A:
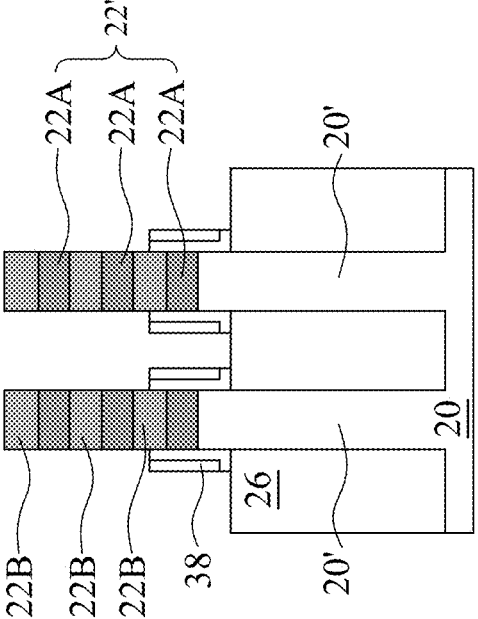

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Gate spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
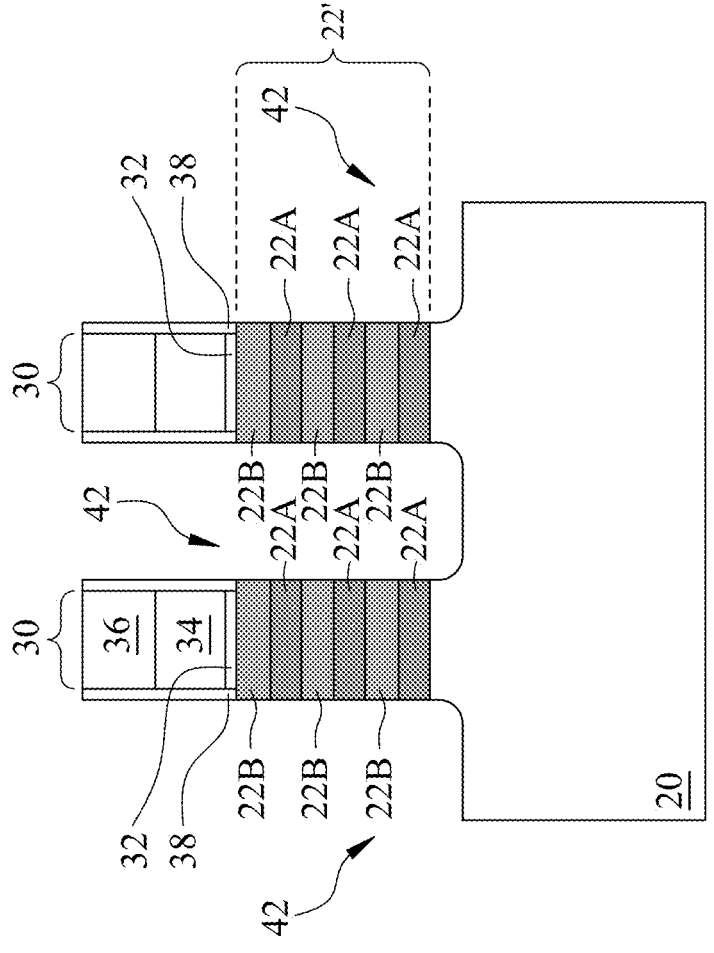
Figure 6A:
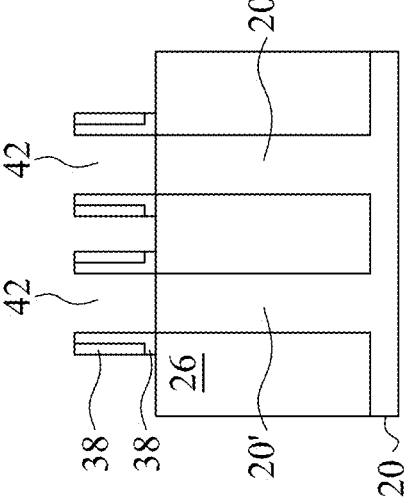

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 28. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
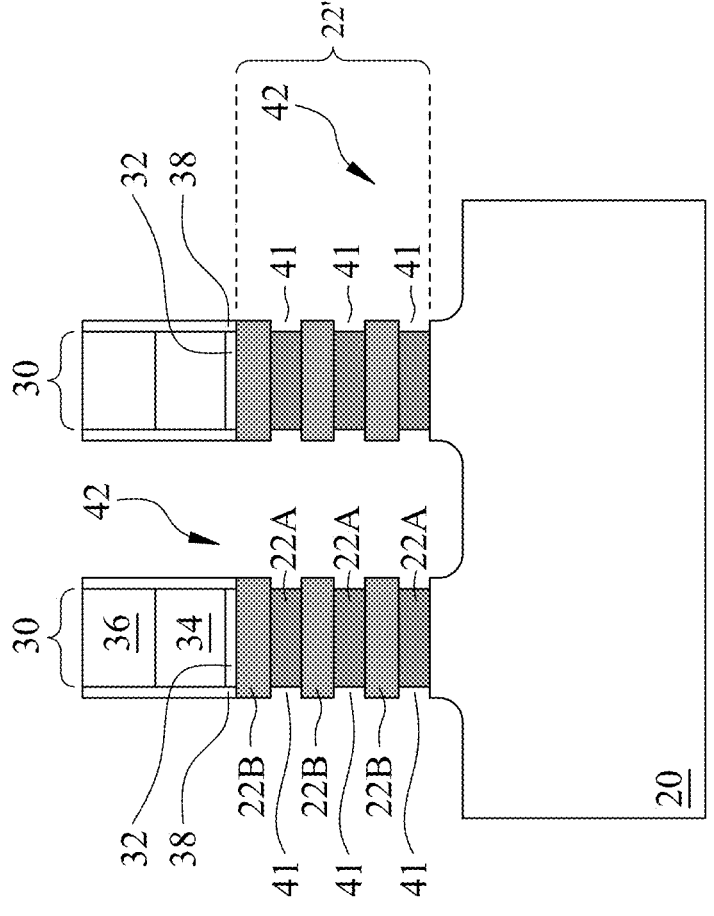
Figure 7A:
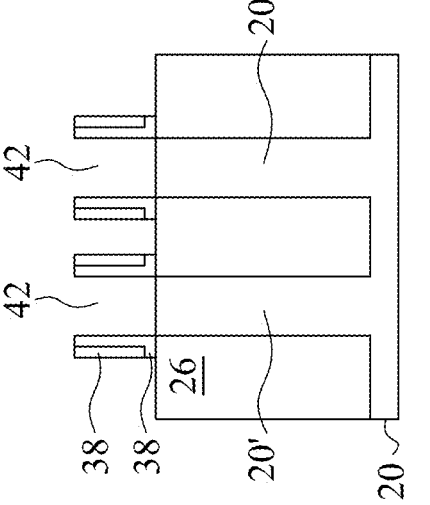

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 28. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
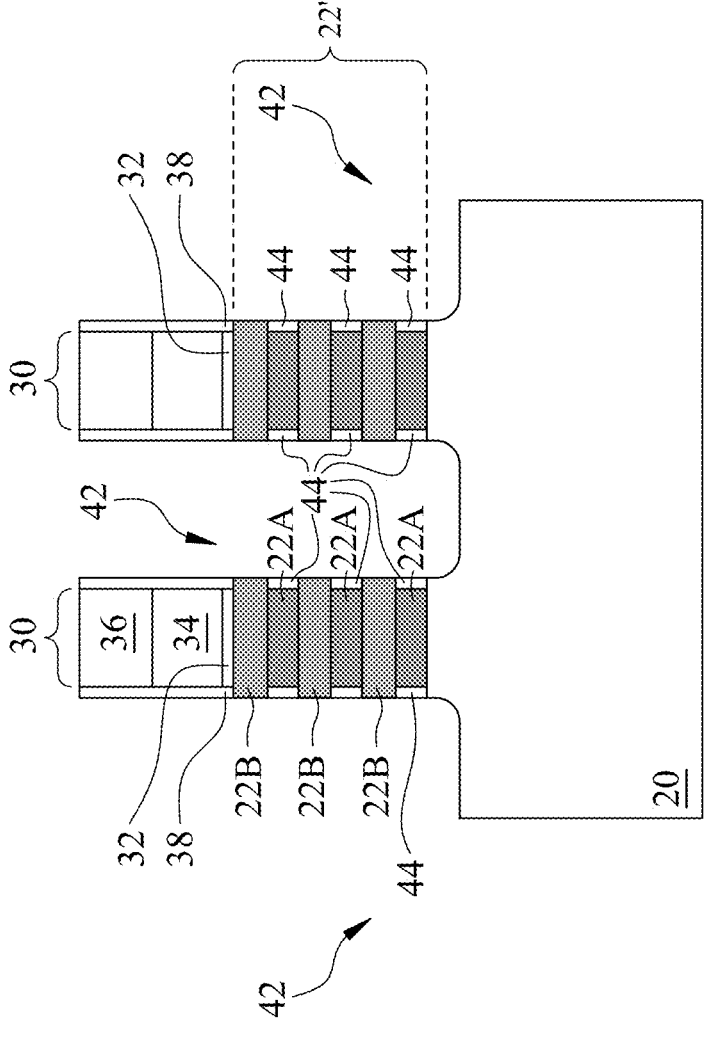
Figure 8A:
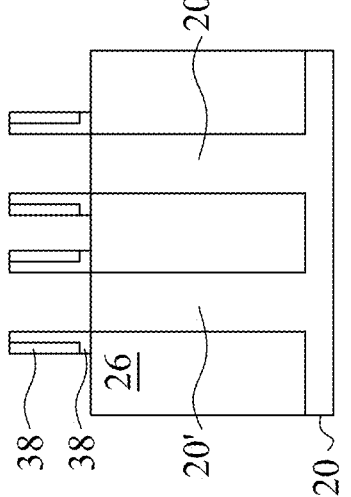

FIGS. 8A and 8B illustrate the formation of inner spacers 44. The respective process is illustrated as process 214 in the process flow 200 shown in FIG. 28. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9B:
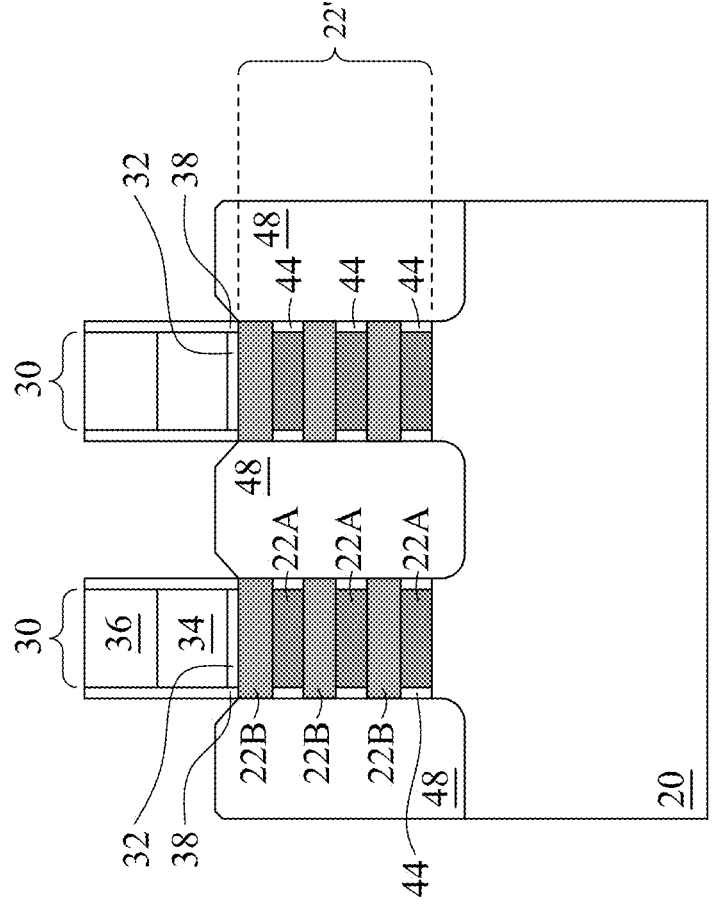
Figure 9A:
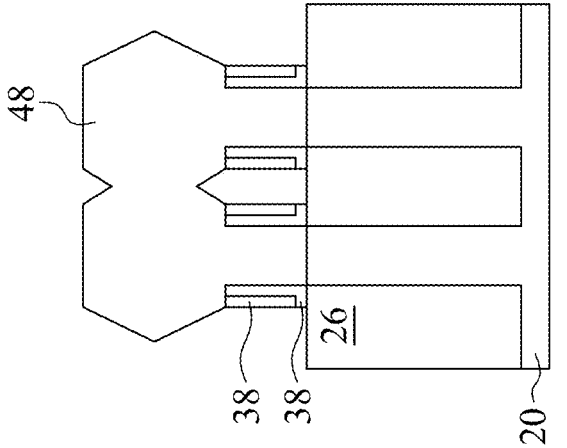

Referring to FIGS. 9A and 9B, epitaxial source/drain regions 48 are formed in recesses 42. The respective process is illustrated as process 216 in the process flow 200 shown in FIG. 28. In accordance with some embodiments, the source/drain regions 48 may exert stress on the nanostructures 22B, which are used as the channels of the corresponding GAA transistors, thereby improving performance. In accordance with some embodiments, the corresponding transistor is n-type, and epitaxial source/drain regions 48 are accordingly formed as of n-type by doping an n-type dopant. For example, silicon phosphorous (SiP), silicon carbon phosphorous (SiCP), or the like may be grown to form epitaxial source/drain regions 48. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other.

After the epitaxy process, epitaxy regions 48 may be further implanted with an n-type impurity to form source and drain regions, which are also denoted using reference numeral 48. In accordance with alternative embodiments of the present disclosure, the implantation process is skipped when epitaxy regions 48 are in-situ doped with the n-type impurity during the epitaxy, and the epitaxy regions 48 are also source/drain regions.

Figures 10A, 10B:
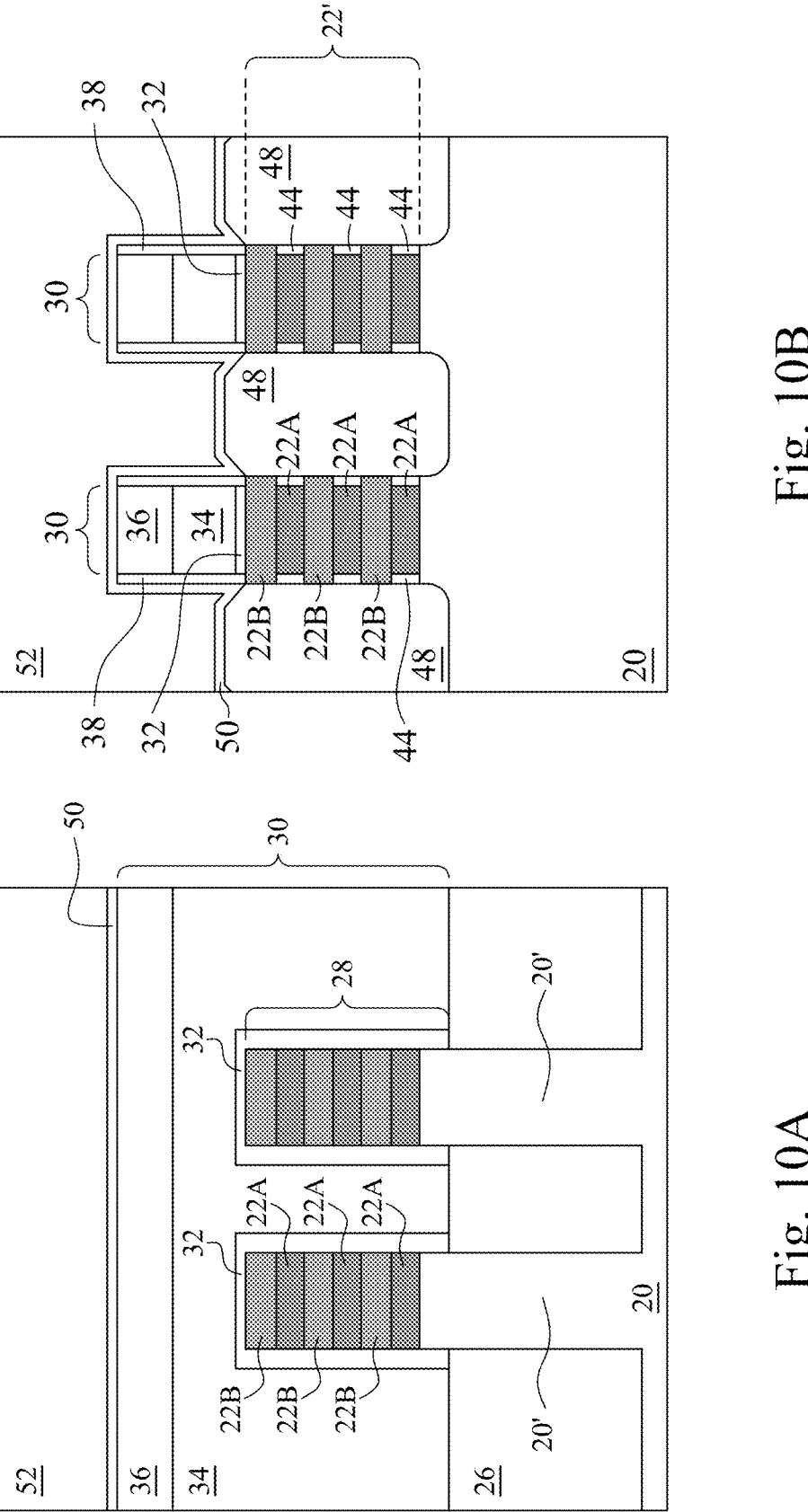
Figure 10C:
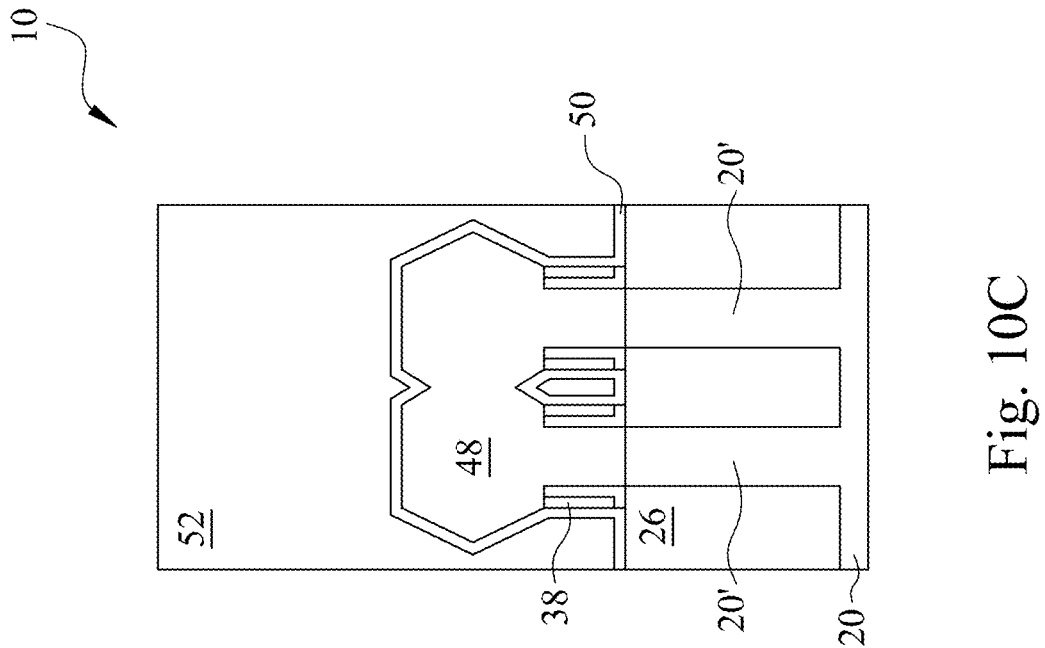

FIGS. 10A, 10B, and 10C illustrate the cross-sectional views of the structure after the formation of Contact Etch Stop Layer (CESL) 50 and Inter-Layer Dielectric (ILD) 52. FIGS. 10A, 10B, and 10C are obtained from the same cross-section same as the cross-sections A2-A2, B-B, and A1-A1, respectively, in FIG. 4. The respective process is illustrated as process 218 in the process flow 200 shown in FIG. 28. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 11B:
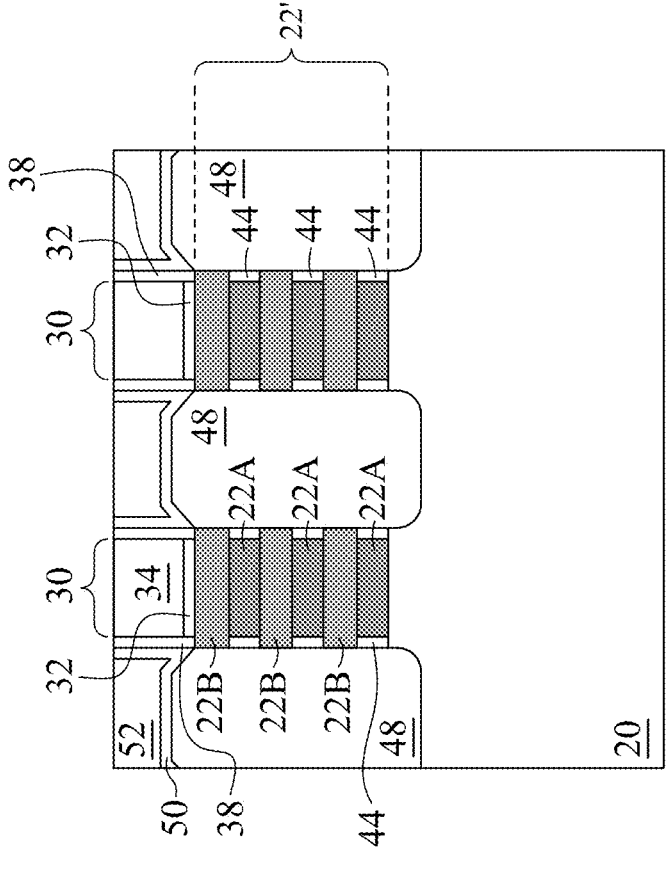
Figure 11A:
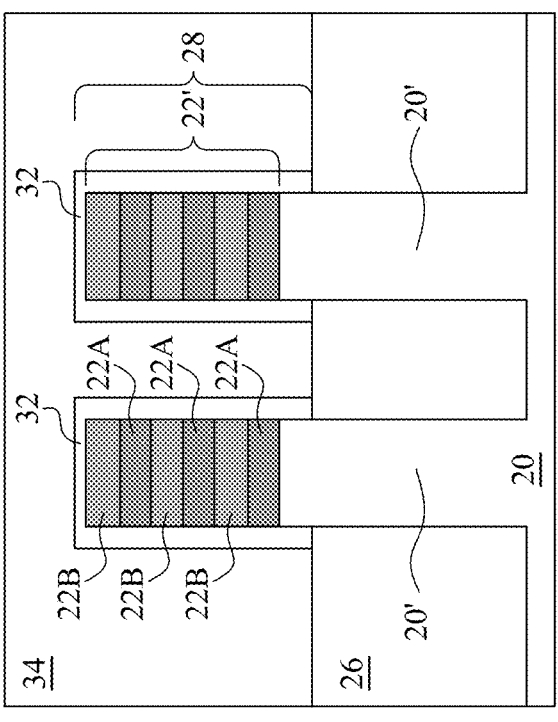

In subsequent processes, replacement gate stacks are formed to replace dummy gate stacks 30. Referring to FIGS. 11A and 11B, a planarization process such as a CMP process or a mechanical grinding process is performed to level the top surface of ILD 52. The respective process is illustrated as process 220 in the process flow 200 shown in FIG. 28. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12B:
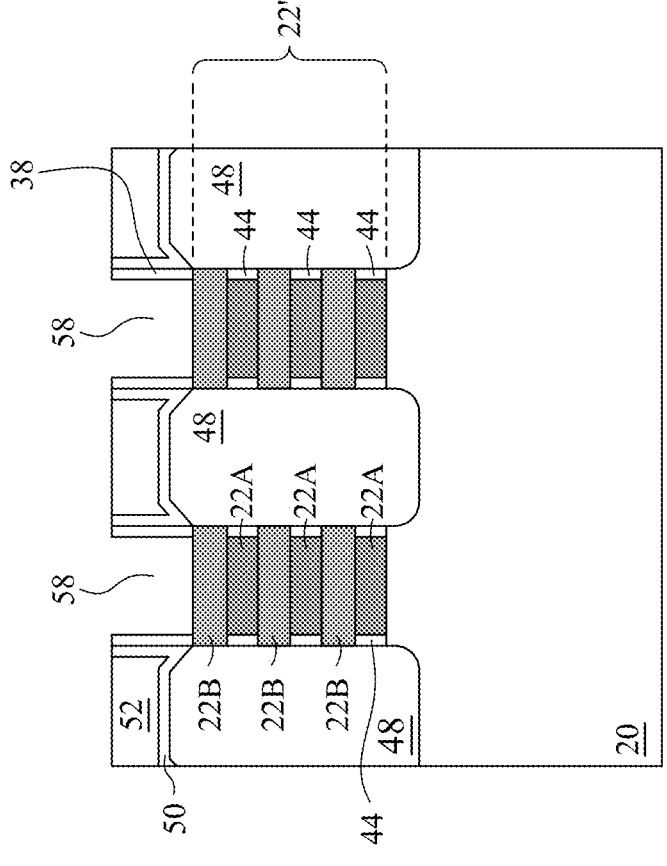
Figure 12A:
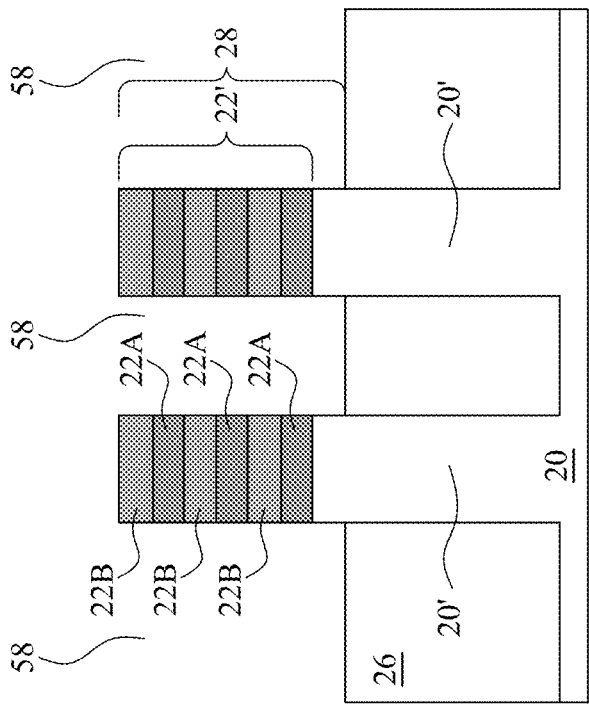

Next, dummy gate electrodes 34 (and hard masks 36, if remaining) are removed in one or more etching processes, so that recesses 58 are formed, as shown in FIGS. 12A and 12B. The respective process is illustrated as process 222 in the process flow 200 shown in FIG. 28. The portions of the dummy gate dielectrics 32 in recesses 58 are also removed. In accordance with some embodiments, dummy gate electrodes 34 and dummy gate dielectrics 32 are removed through dry etching processes. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The corresponding portions of the multilayer stacks 22' are between neighboring pairs of the epitaxial source/drain regions 48.

Figure 13B:
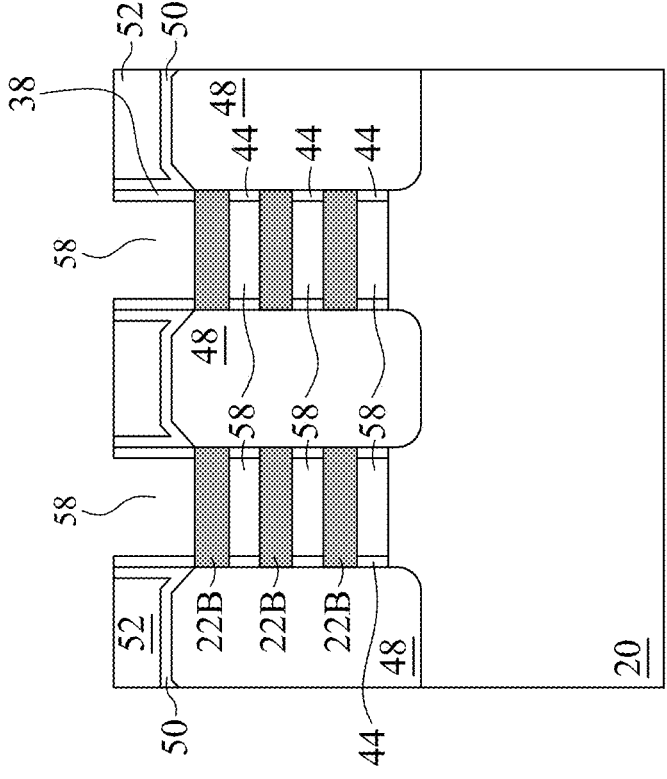
Figure 13A:
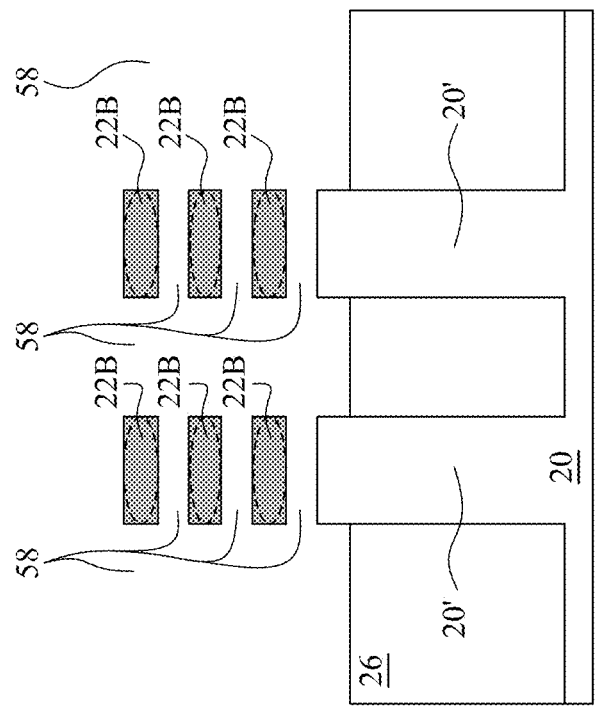

Sacrificial layers 22A are then removed to extend recesses 58 between nanostructures 22B, and the resulting structure is shown in FIGS. 13A and 13B. The respective process is illustrated as process 224 in the process flow 200 shown in FIG. 28. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide (NH₄OH), or the like may be used to remove sacrificial layers 22A. It is appreciated that although FIG. 13A and subsequent figures illustrate the cross-sections of nanostructures 22B as being rectangular, nanostructures 22B may have rounded corners, as illustrated by dashed lines in FIG. 13A.

Figure 14:
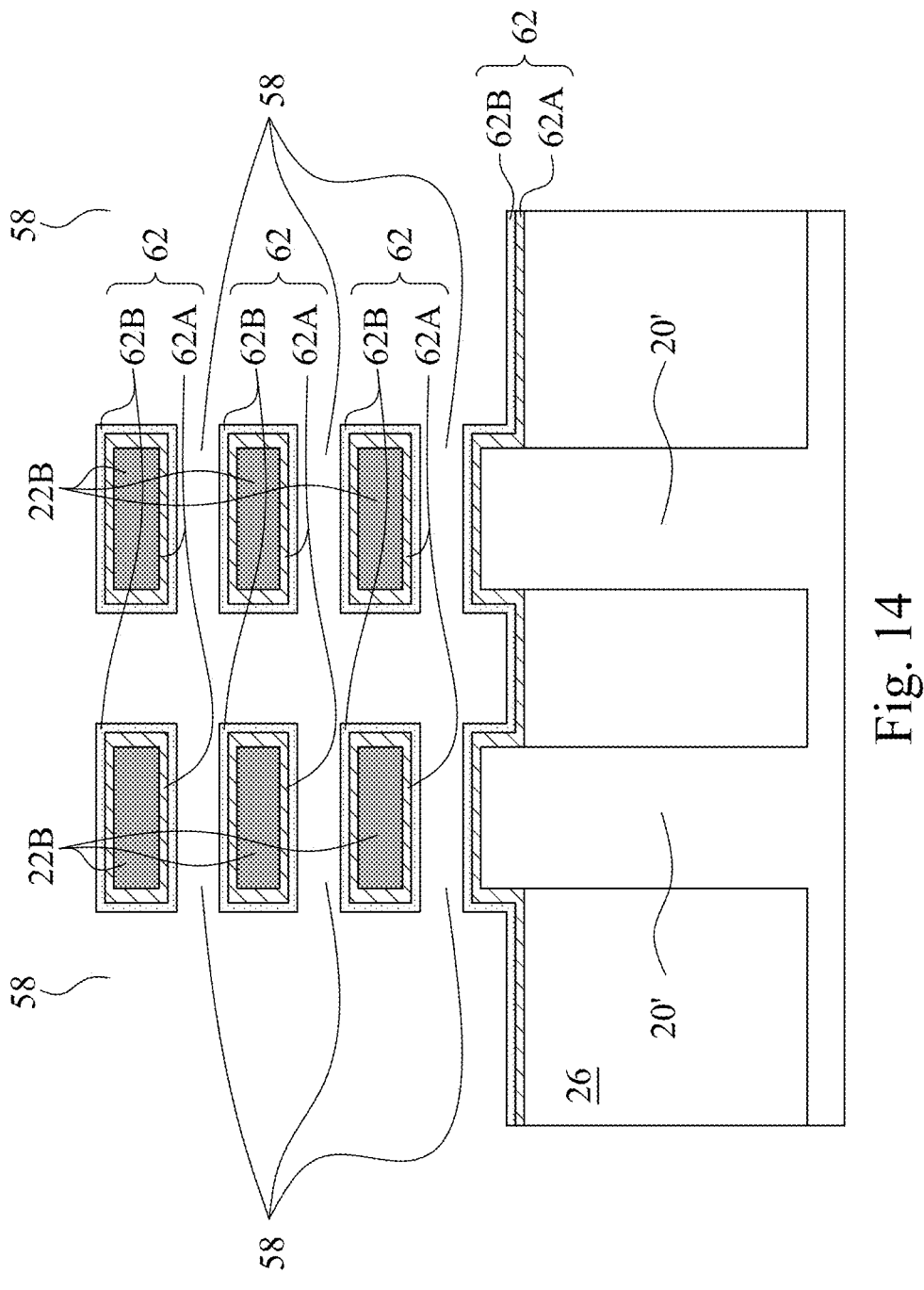

Referring to FIG. 14, gate dielectrics 62 are formed. The respective process is illustrated as process 226 in the process flow 200 shown in FIG. 28. In accordance with some embodiments, each of gate dielectrics 62 includes interfacial layer 62A and high-k dielectric layer 62B on the interfacial layer 62A. The interfacial layer 62A may be formed of or comprises silicon oxide, which may be deposited through a conformal deposition process such as ALD or CVD. In accordance with alternative embodiments, interfacial layer

62A is formed through thermal oxidation. When formed through thermal oxidation, the portions of interfacial layer 62A on the top surfaces of STI regions 26 will not be formed. In accordance with some embodiments, the high-k dielectric layers 62B comprise one or more dielectric layers. For example, the high-k dielectric layer(s) 62B may include a metal oxide or a silicate of hafnium, aluminum, zirconium, lanthanum, manganese, barium, titanium, lead, or combinations thereof.

Figure 15:
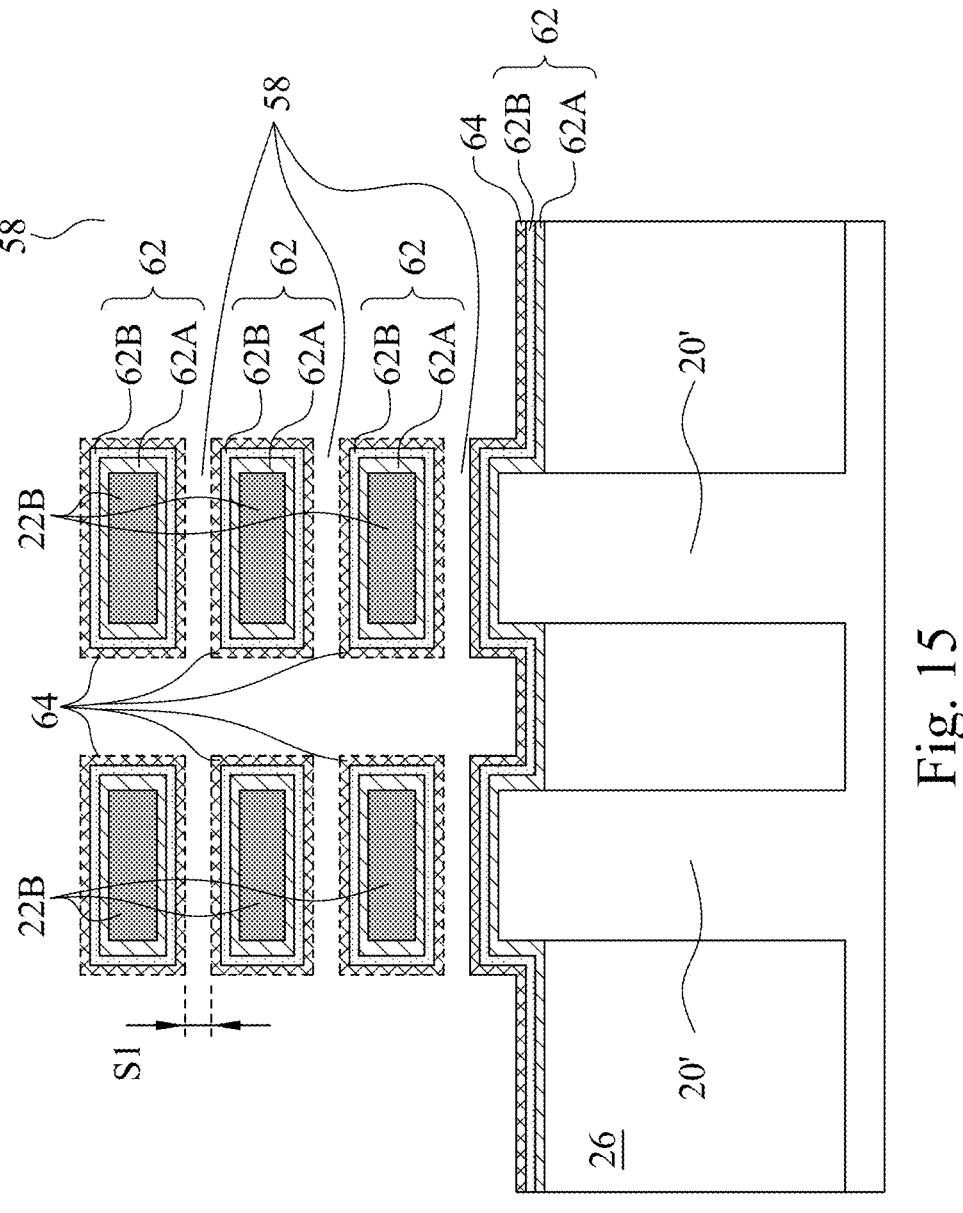

FIG. 15 illustrates the formation of work-function layer 64. The respective process is illustrated as process 228 in the process flow 200 shown in FIG. 28. Work-function layer 64 may be an n-type work-function layer when the resulting transistor is an n-type transistor, or may be a p-type work-function layer when the resulting transistor is a p-type transistor. In accordance with some embodiments, work-function layer 64 is an n-type work-function layer, and may be formed of or comprise TiAlC, TiAl, TiAlN, TaAl, TaAlN, TaAlC, or the like. Alternatively, work-function layer 64 is a p-type work-function layer, and may be formed of or comprise TiN, TaN, TiSiN, WCN, MOON, or the combinations thereof. In accordance with some embodiments, a capping layer (not shown) such as a TiN layer or a TiSiN layer is formed between (and contacting both of) the work-function layer 64 and the gate dielectric 62. In accordance with alternative embodiments, work-function layer 64 is in physical contact with gate dielectric 62, with no capping layer in between. The formation of work-function layer 64 may include Atomic Layer Deposition (ALD), Chemical Vapor Deposition (CVD), or the like.

Figure 16:
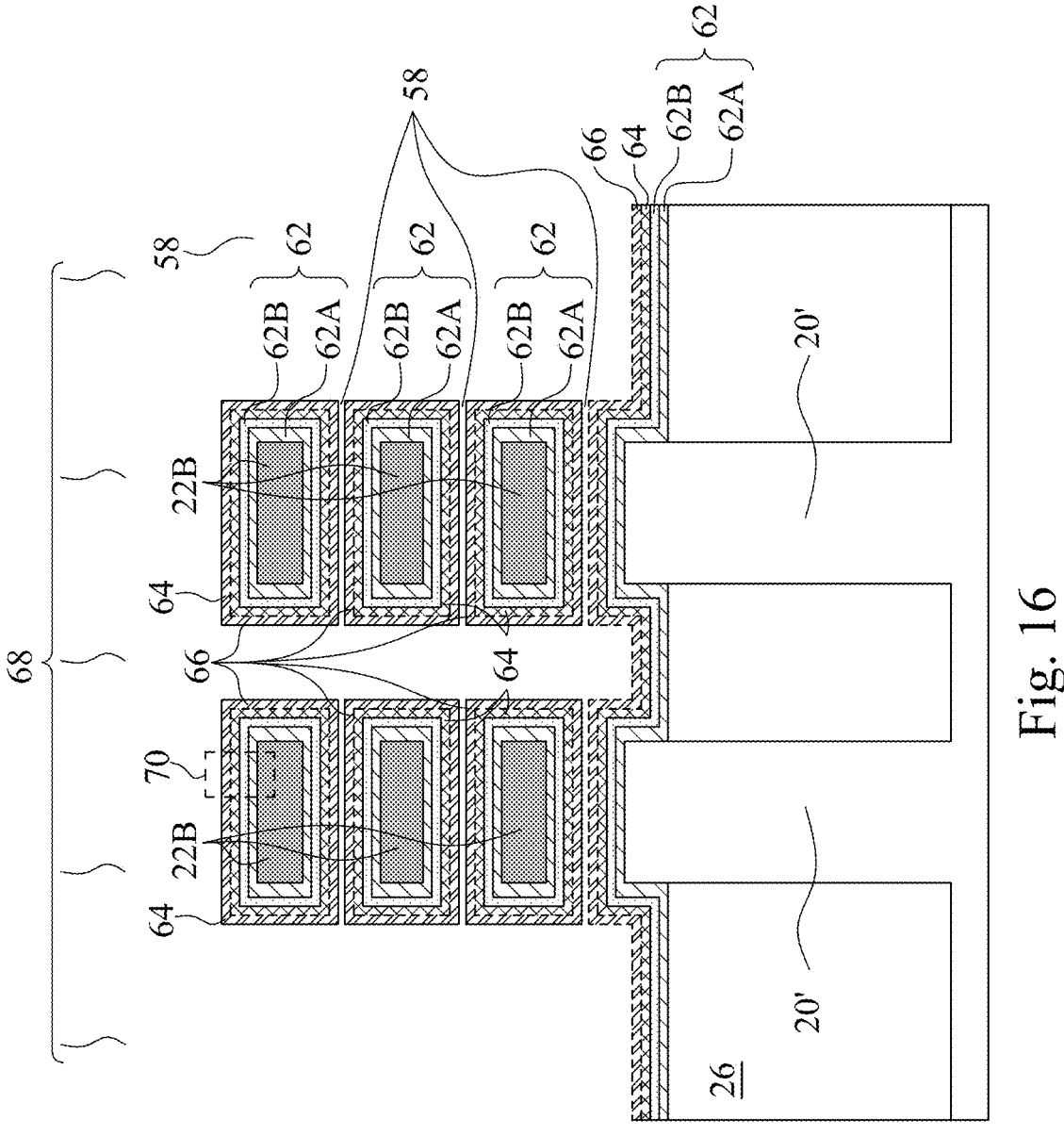

In accordance with some embodiments, as shown in FIG. 15, work-function layer 64 is formed before the subsequent fluorine-incorporation process 68 as shown in FIG. 16. The corresponding fluorine-incorporation process 68 is also discussed in subsequent paragraphs referring to FIGS. 22 and 24. In accordance with alternative embodiments, work-function layer 64 is formed after the subsequent fluorine-incorporation process 68 as shown in FIG. 16. The corresponding fluorine-incorporation process 68 is discussed in subsequent paragraphs referring to FIGS. 23 and 25. Work-function layer 64 is thus illustrated as being dashed in FIG. 15 to indicate that it may be, or may not be, formed at this time and at the time fluorine-incorporation process 68 is performed.

Referring to FIG. 16, fluorine-incorporation process 68 is performed. The respective process is illustrated as process 230 in the process flow 200 shown in FIG. 28. The fluorine-incorporation process 68 is used to incorporate fluorine into high-k dielectric layer 62B, so that high-k dielectric layer 62B is passivated, and the defects in high-k dielectric layer 62B are repaired. Fluorine-containing layer 66 may be formed as a result of fluorine-incorporation process 68 in accordance with some embodiments.

Figure 22:
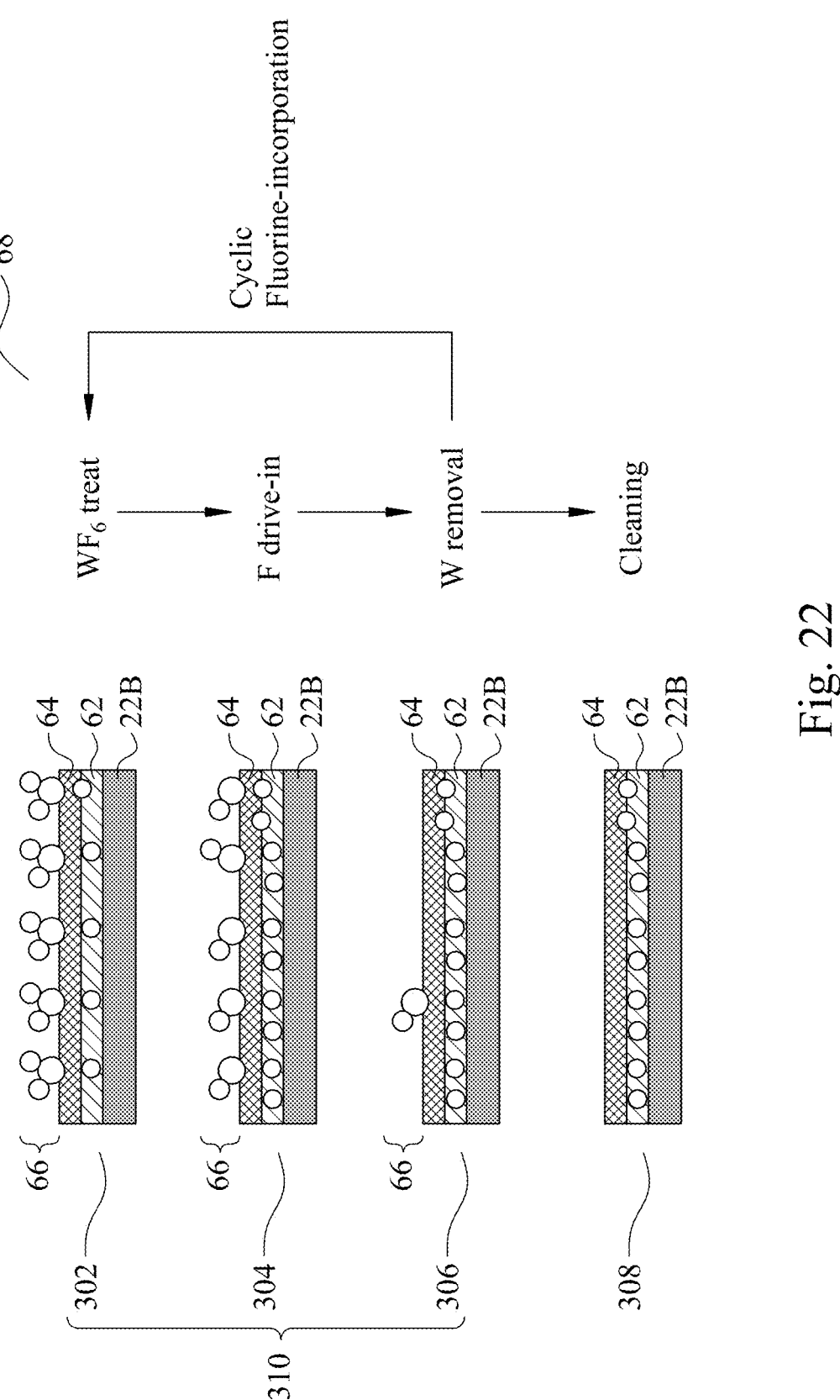
FIGS. 22-25 illustrate some fluorine-incorporation processes in accordance with some embodiments.
Figure 23:
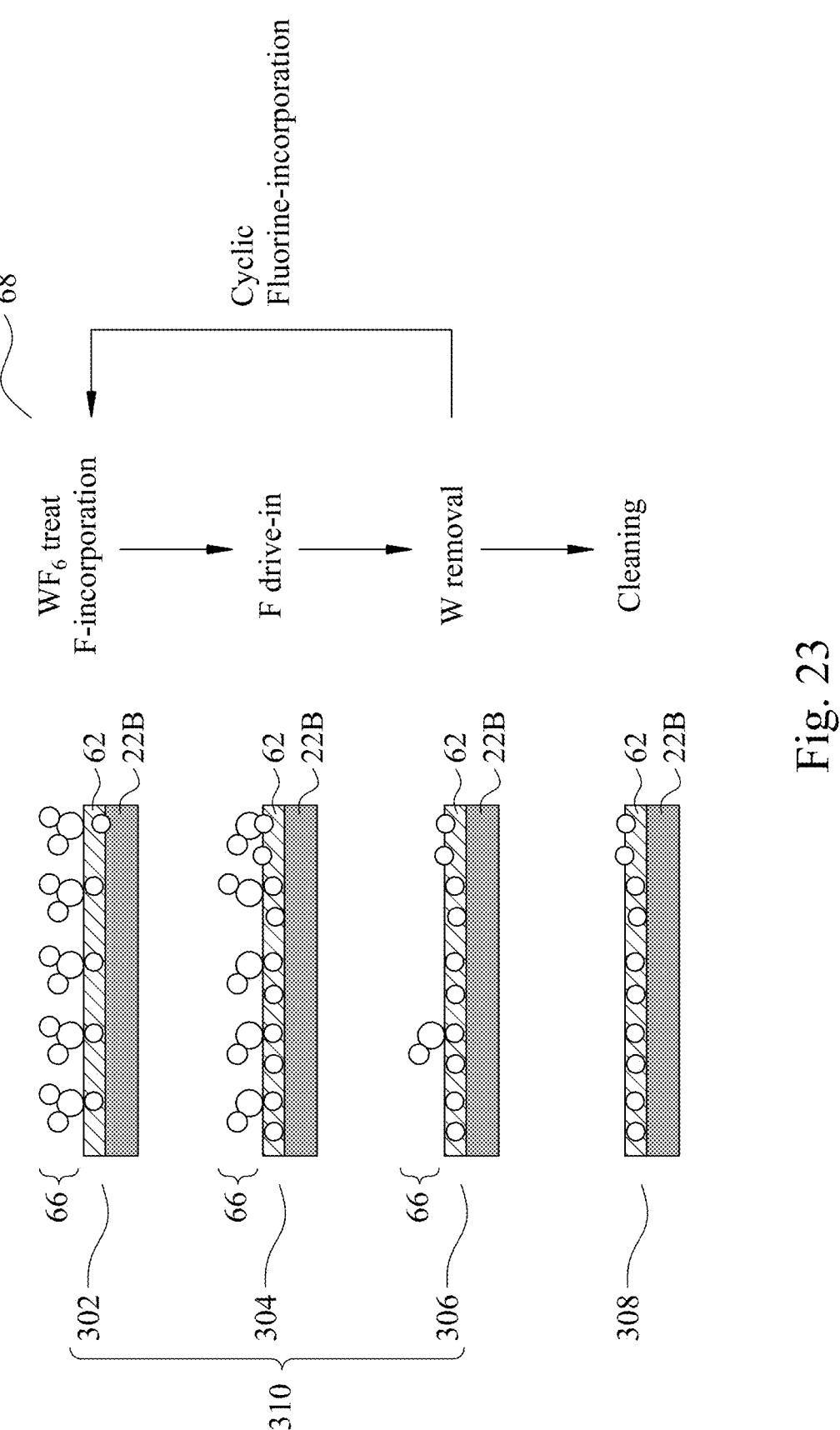
Figure 24:
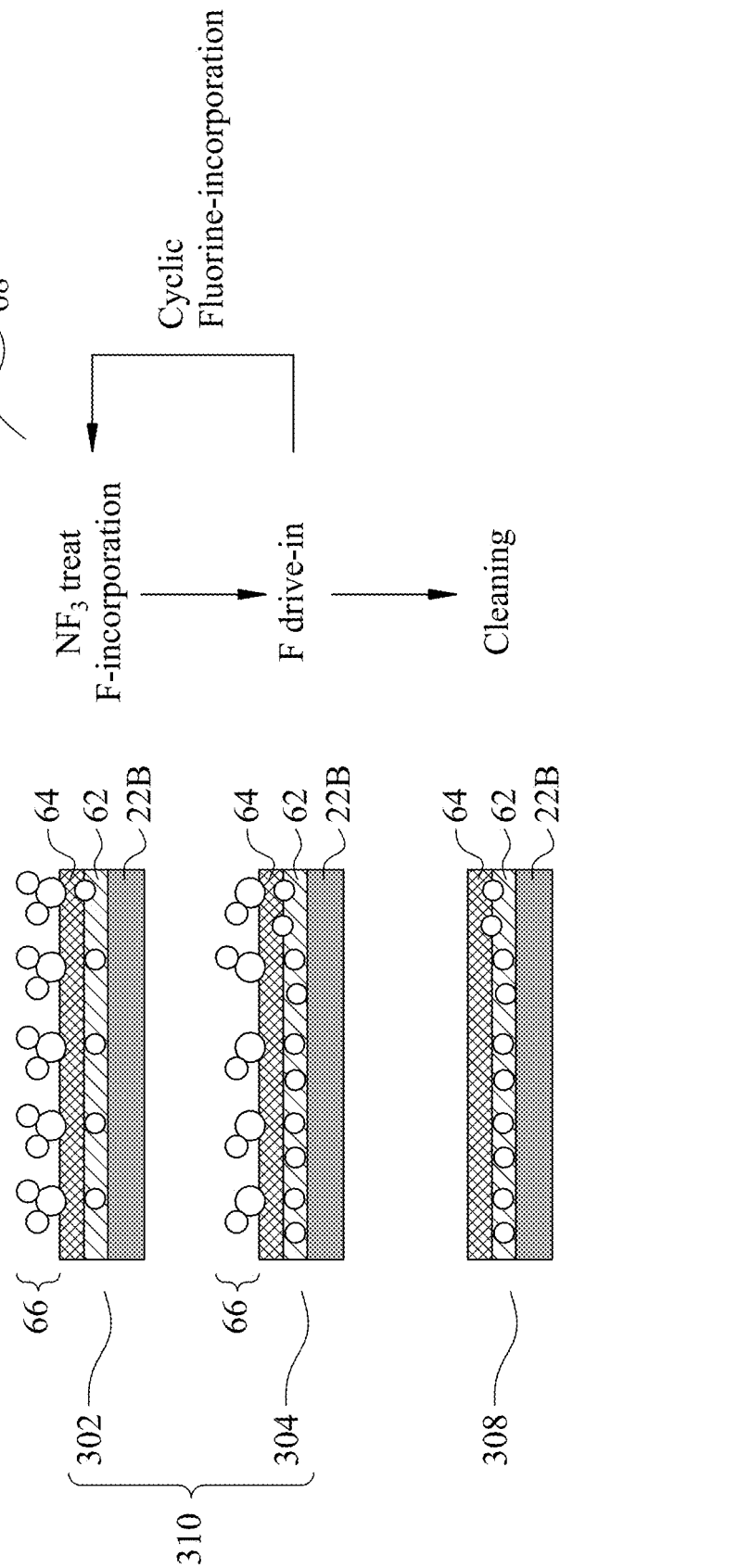

FIGS. 22 through 24 illustrate the details of some example fluorine-incorporation processes 68 in accordance with various embodiments. The portions of the structure shown in FIGS. 22 through 24 may correspond to the region 70 as shown in FIG. 16.

FIG. 22 illustrates an example fluorine-incorporation process 68 performed after the formation of work-function layer 64. Accordingly, work-function layer 64 is a surface layer, with gate dielectric 62 (including high-k dielectric layer 62B and interfacial layer 62A) and nanostructure 22B being under work-function layer 64. The fluorine-incorporation process 68 may comprise treatment process 302 performed using a fluorine-containing gas comprising tungsten fluoride (WF₆). In accordance with some embodiments, treatment process 302 is performed in a vacuum chamber, and is performed using pure fluorine-containing gas, with no other gas added, or using substantially pure fluorine-containing gas, for example, with the atomic percentage of the fluorine-containing gas being greater than about 90 percent, 95 percent, or 99 percent among all gases in the vacuum chamber. In accordance with alternative embodiments, a carrier gas is added to the fluorine-containing gas. The carrier gas may include $N_2$, Ar, He, or the like, or combinations thereof. Treatment process 302 may also be performed in a furnace, which may or may not be vacuumed.

In accordance with some embodiments, treatment process 302 comprises a thermal treatment process performed at an elevated wafer temperature, which may be in the range between about 250° C. and about 600° C. In accordance with alternative embodiments, treatment process 302 comprises a plasma treatment performed in the vacuum chamber. The pressure in the vacuum chamber may be in the range between about 0.5 Torr and about 50 Torr. Treatment process 302 may last for a period of time in the range between about 1 second and about 600 seconds. In accordance with yet alternative embodiments, the treatment process 302 comprises both of the thermal treatment process and the plasma treatment process, as discussed above.

As a result of treatment process 302, the fluorine-containing gas may be adsorbed on the surfaces of work-function layer 64, which may (or may not) result in the deposition of fluorine-containing layer 66. Fluorine-containing layer 66 also comprises tungsten when $WF_6$ is used. Other gases such as $SiH_4$, $B_2H_6$, $H_2$, or the like, or combinations thereof may also be added to the process gas used in treatment process 302 to aid the deposition of fluorine-containing layer 66. The resulting fluorine-containing layer 66 may be a continuous layer, with the coverage of the underlying layer being equal to 100 percent. Alternatively, fluorine-containing layer 66 may have a coverage of the underlying layer as being smaller than 100 percent, with some portions of the underlying layer being exposed through fluorine-containing layer 66, as schematically illustrated in FIG. 22.

Further referring to FIG. 22, fluorine drive-in process 304 is performed. Fluorine drive-in process 304 may be in-situ performed in the same environment (such as the vacuum chamber or the furnace) in which treatment process 302 is performed. Alternatively, fluorine drive-in process 304 may be ex-situ performed in a different environment than the environment in which treatment process 302 is performed. For example, fluorine drive-in process 304 may be performed in another vacuum chamber or furnace. Fluorine drive-in process 304 may be performed at an elevated wafer temperature, which may be higher than or equal to the wafer temperature of the treatment process 302. For example, the wafer temperature in the fluorine drive-in process 304 may be in the range between about 400° C. and about 650° C. During the fluorine drive-in process 304, gases such as $N_2$, Ar, He, Ne, or the like may be conducted to prevent work-function layer 604 from being oxidized.

The fluorine-containing gas used in the treatment process 302 may be stopped during fluorine drive-in process 304. Alternatively, the fluorine-containing gas is also conducted, but at a lower flow rate than the flow rate of the fluorine-containing gas in the treatment. In the drive-in process 304, the pressure of the vacuum chamber (if used) may be in the range between about 0.5 Torr and about 760 Torr (one atmosphere). Fluorine drive-in process 304 may last for a period of time in the range between about 1 second and about 600 seconds.

In accordance with alternative embodiments, no fluorine drive-in process is performed. Since treatment process 302 comprises a thermal treatment process and/or a plasma treatment process, during treatment process 302, fluorine can still diffuse into work-function layer 64 and gate dielectric layer 62.

In the fluorine drive-in process 304, fluorine and tungsten are driven into (diffuse into) work-function layer 64, gate dielectric 62, and possibly nanostructures 22B. Tungsten is heavier and hence has a lower diffusion rate than fluorine. Accordingly, after the fluorine drive-in process 304, fluorine-containing layer 66 has some remaining portions not diffused. Residue-removal process 306 is thus performed to remove the residue of fluorine-containing layer 66. During residue-removal process 306, the fluorine-containing process gases (such as $WF_6$) used in treatment process 302 is stopped. In accordance with some embodiments, the residue-removal process 306 may be performed using an etching gas comprising nitrogen fluoride ($NF_3$). In accordance with some embodiments, residue-removal process 306 is performed in a vacuum chamber, and is performed using pure or substantially pure etching gas, with no other gas added. For example, the atomic percentage of the etching gas (such as $NF_3$) may be greater than about 90 percent, 95 percent, or 99 percent of all gases in the vacuum chamber. In accordance with alternative embodiments, a carrier gas is added to the etching gas such as $NF_3$. The carrier gas may include $N_2$, Ar, He, or the like.

In accordance with some embodiments, residue-removal process 306 comprises a thermal etching process performed at an elevated wafer temperature, which may be in the range between about 250° C. and about 600° C. In accordance with some embodiments, residue-removal process 306 comprises a plasma etching process performed in the vacuum chamber. The pressure of the vacuum chamber may be in the range between about 0.5 Torr and about 50 Torr. As a result of the etching process, the remaining fluorine-containing layer 66 may be full removed, or may be partially removed, with smaller residue portion remaining.

Treatment process 302, fluorine drive-in process 304, and residue-removal process 306 are collectively referred to as fluorine-incorporation cycle 310. In accordance with some embodiments, after fluorine-incorporation cycle 310, the process proceeds back to process 302, and one or more fluorine-incorporation cycles 310 are performed. The total number of fluorine-incorporation cycles 310 may be 2, 3, 4, 5, or more.

Incorporating fluorine through fluorine-incorporation cycles 310, in which fluorine-containing layer 66 is removed in each cycle, has some advantageous features. The gaps between neighboring nanostructures 22B have small spacings S1 (FIG. 15), especially after the formation of gate dielectric layers 62 and work-function layers 64. In order to diffuse enough fluorine into gate dielectric layer, fluorine-containing layer 66 may be thick. The thick fluorine-containing layer 66, however, may block the gaps, and the fluorine-containing layer 66 deposited on an overlying nanostructure 22B may be merged with the fluorine-containing layer 66 deposited on an underlying nanostructure 22B. The merging may prevent the subsequent layers from being deposited into the gaps, causing performance degradation and reliability degradation.

By performing a residue-removal process 306 in each of the fluorine-incorporation cycles 310, the gaps are cleared before the merging occurs. Furthermore, the fluorine drive-in process 304 may cause the fluorine concentration in the residue fluorine-containing layer 66 to be lower. By removing the fluorine-containing layer 66 and forming new fluorine-containing layer 66, fluorine is replenished, and more fluorine may be diffused to high-k dielectric layer 62, hence improving the efficiency in the defect-repair process.

Further referring to FIG. 22, after the fluorine-incorporation cycles 310, cleaning process 308 is performed. Cleaning process 308 may remove the tungsten on work-function layer 64, if the tungsten is not fully removed in preceding residue-removal processes 306. Cleaning process 308 may comprise a wet etching process or a dry etching process. In accordance with some embodiments, cleaning process 308 is performed using an etching chemical that comprises an oxidant-containing solution, which may include deionized water and an oxidant(s). For example, the etching chemical may include $H_2O_2$, $DiO_3$, the mixture of $NH_4OH$, $H_2O_2$, and $H_2O$, the mixture of $NH_4OH$ and $O_3$, the mixture of $HCl$ and $H_2O_2$, the mixture of $HCl$ and $O_3$, or the like. The concentration of the oxidant in the oxidant-containing solution may be in the range between about 20 percent and about 50 percent. Cleaning process 308 may be performed a temperature in the range between about 18° C. and about 80° C.

FIG. 23 illustrates the fluorine-incorporation process 68 in accordance with alternative embodiments. The processes shown in FIG. 23 are essentially the same as what are shown in FIG. 22, except that in FIG. 23, fluorine-incorporation process 68 is performed on gate dielectric layer 62, and is performed before the formation of work-function layer 64. The details of the fluorine-incorporation process 68 are not repeated herein.

FIG. 24 illustrates the fluorine-incorporation process 68 in accordance with alternative embodiments. The processes shown in FIG. 24 are essentially the same as what are shown in FIG. 22, except that instead of using $WF_6$ to perform treatment process 302, $NF_3$ is used as in treatment process 302. Furthermore, the residue fluorine-containing layer 66 (which contains the adsorbed $NF_3$) is thin. After drive-in process 304, the residue is even thinner. Therefore, no residue-removal process is performed.

As shown in FIG. 24, treatment process 302 is performed. The treatment process 302 is essentially the same as the treatment process 302 discussed referring to FIG. 22, except $NF_3$ replaces $WF_6$ as the fluorine-containing gas. After the treatment process 302, the flow of the fluorine-containing gas such as $NF_3$ is stopped or the flow rate is reduced, and drive-in process 304 is performed. The details of drive-in process 304 may be found referring to the drive-in process 304 in FIG. 22. The drive-in process 304 may also be performed at a higher (or equal) wafer temperature than treatment process 302. The treatment process 302 and the drive-in process 304 are collectively referred to as fluorine-incorporation cycle 310. Fluorine-incorporation cycles 310 are repeated.

Figure 25:
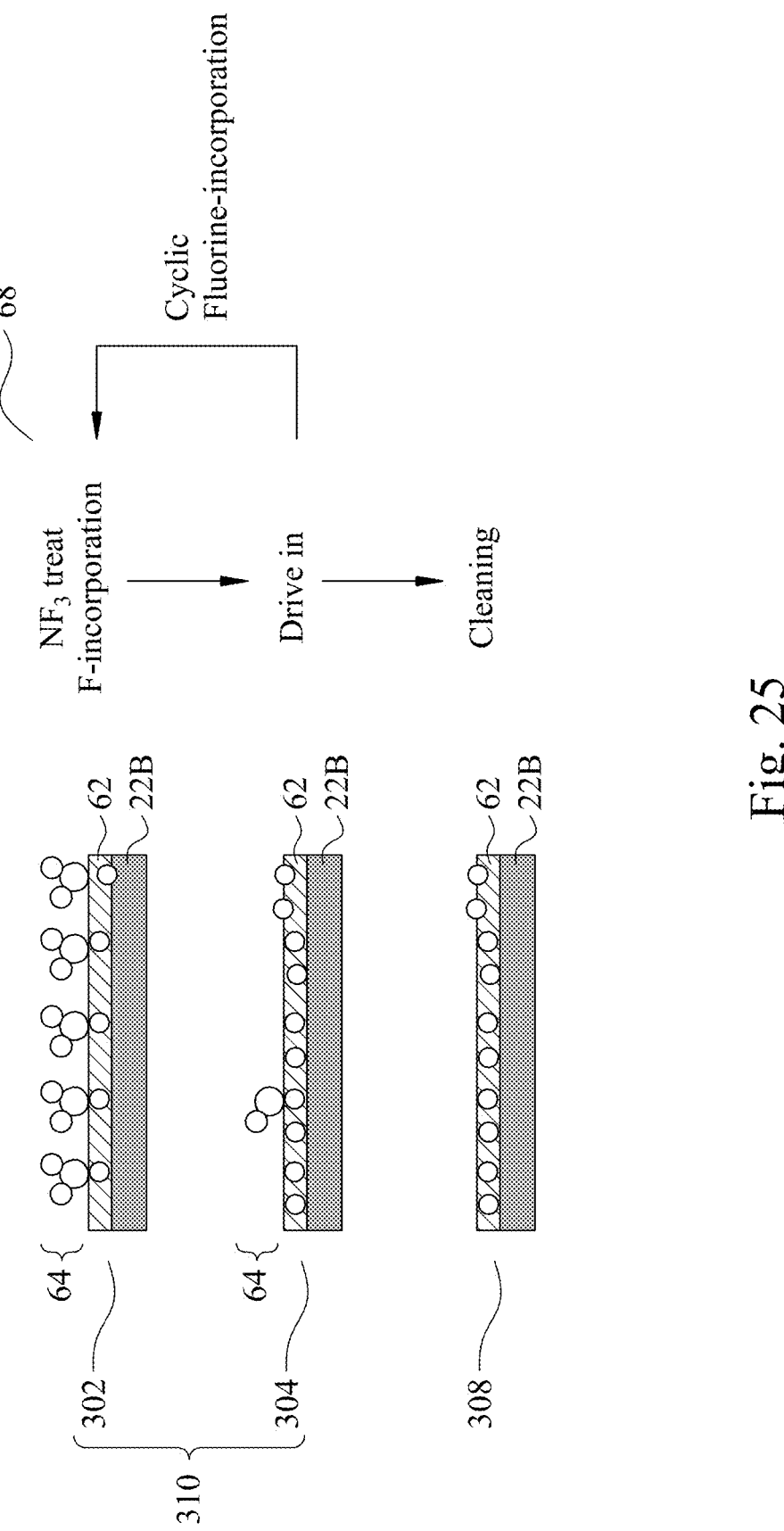

FIG. 25 illustrates the fluorine-incorporation process 68 in accordance with yet alternative embodiments. The processes as shown in FIG. 25 are essentially the same as what are shown in FIG. 24, except that in the process shown in FIG. 25, fluorine-incorporation process 68 is performed on gate dielectric layer 62, and is performed before the formation of work-function layer 64. The details of the fluorine-incorporation process 68 may be found referring to preceding discussion, and are not repeated herein.

Figure 17:
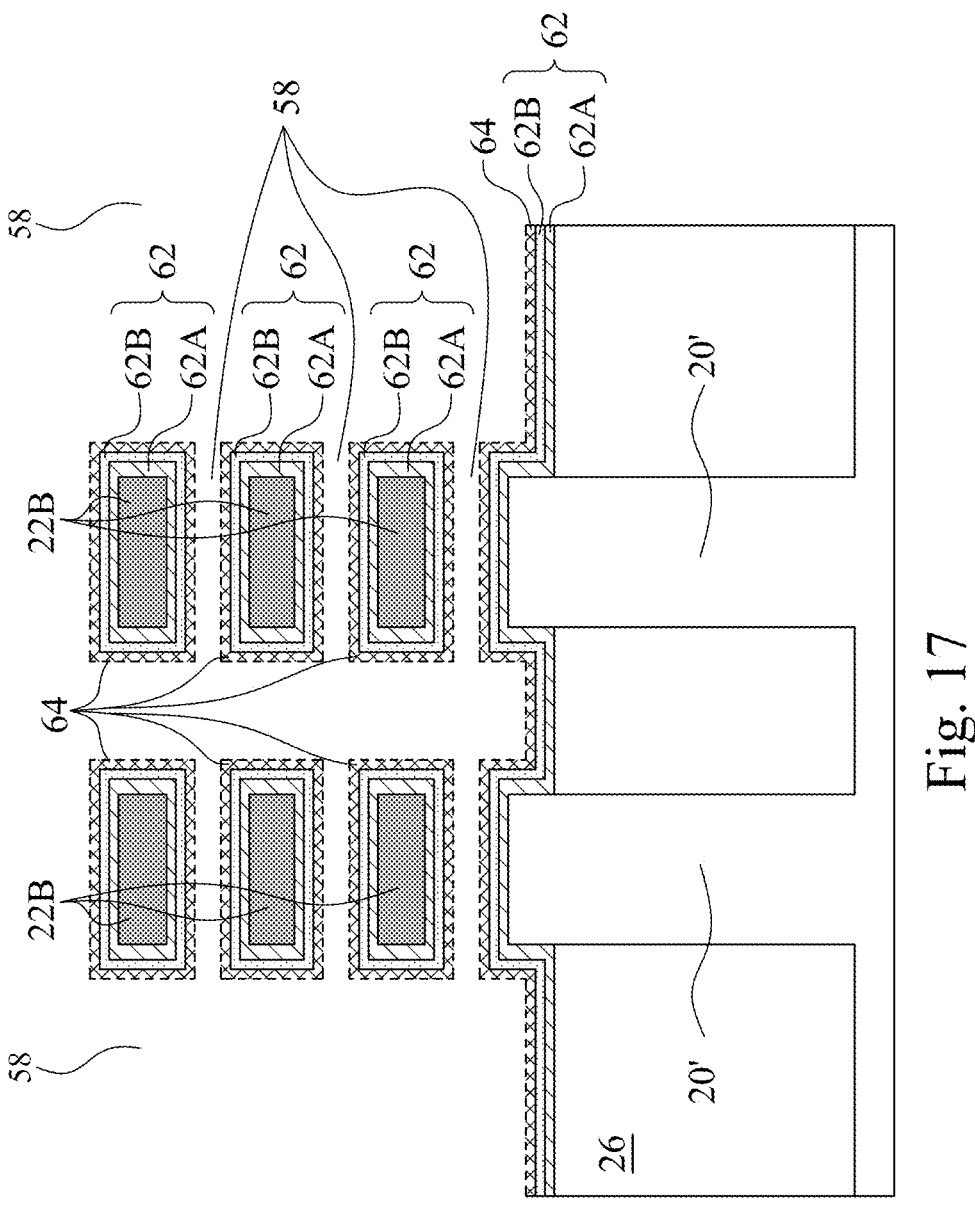

FIG. 17 illustrates the structure after fluorine-incorporation process 68 as discussed referring to FIGS. 22 through 25 has been performed. Work-function layer 64 may have been formed already in the preceding processes, or may not have been formed. If work-function layer 64 has been formed, the process proceeds to what is shown in FIG. 18.

Figure 18:
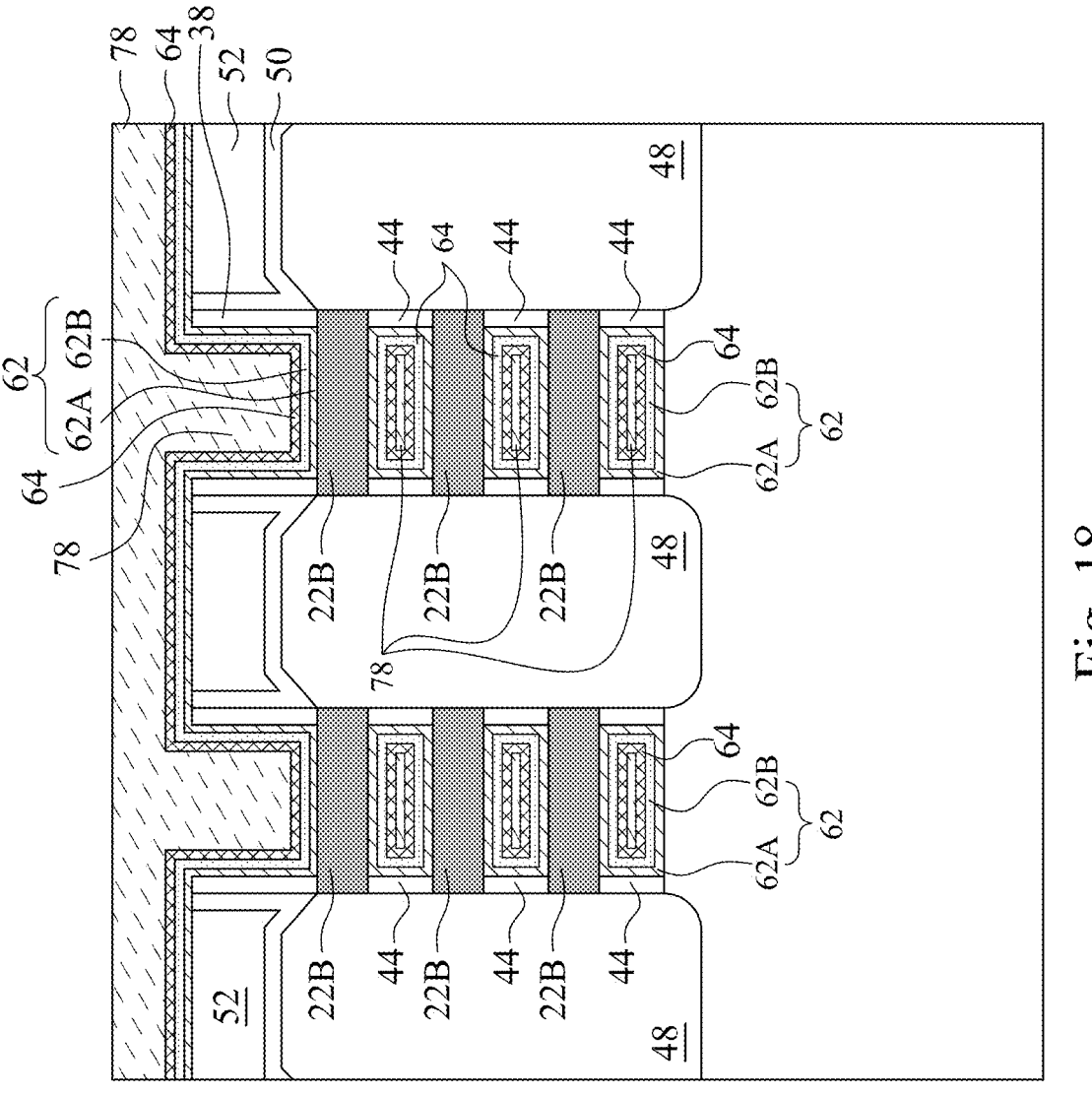

Otherwise, if work-function layer 64 has not been formed, work-function layer 64 will be formed after fluorine-incorporation process 68 and before the process shown in FIG. 18. The respective process is illustrated as process 232 in the process flow 200 shown in FIG. 28.

Referring to FIG. 18, conductive layers 78 are formed over work-function layer 64. The respective process is illustrated as process 234 in the process flow 200 shown in FIG. 28. Conductive layers 78 may or may not include a blocking layer such as a TiN layer. Conductive layers 78 may further include a filling metal filling the remaining recesses 58 if they are not fully filled yet. Conductive layers 78 may include a metal-containing material such as cobalt, ruthenium, aluminum, tungsten, combinations thereof, and/or multilayers thereof.

Figure 19B:
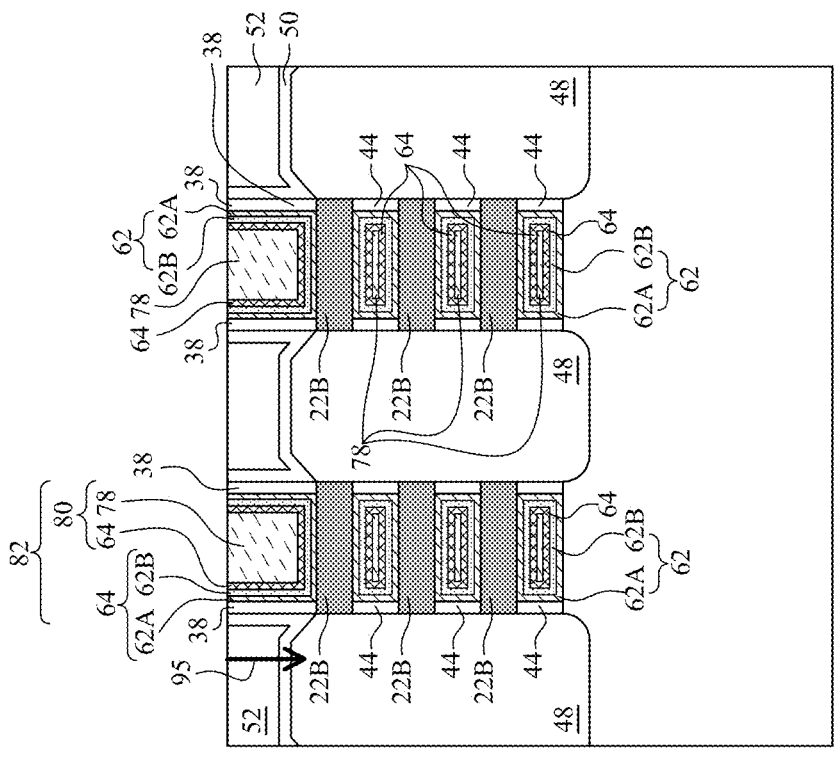
Figure 19A:
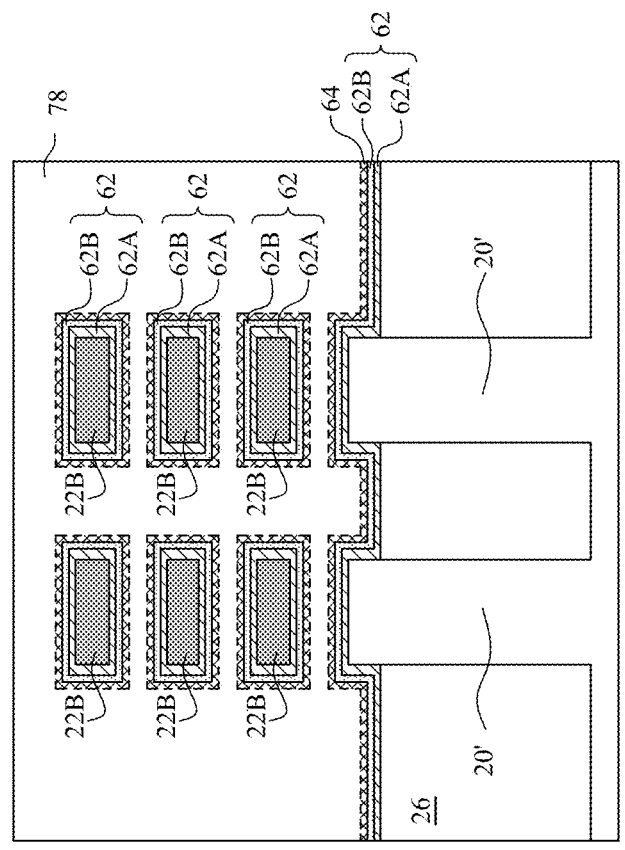

Referring to FIGS. 19A and 19B, after the filling of recesses 58, a planarization process such as a CMP process or a mechanical grinding process is performed to remove the excess portions of gate dielectrics 62 and the material of gate electrodes 80, which excess portions are over the top surface of ILD 52. The remaining portions of the conductive layers 78 form parts of gate electrodes 80. Gate electrodes 80 and gate dielectrics 62 are collectively referred to as gate stacks 82.

Figure 20B:
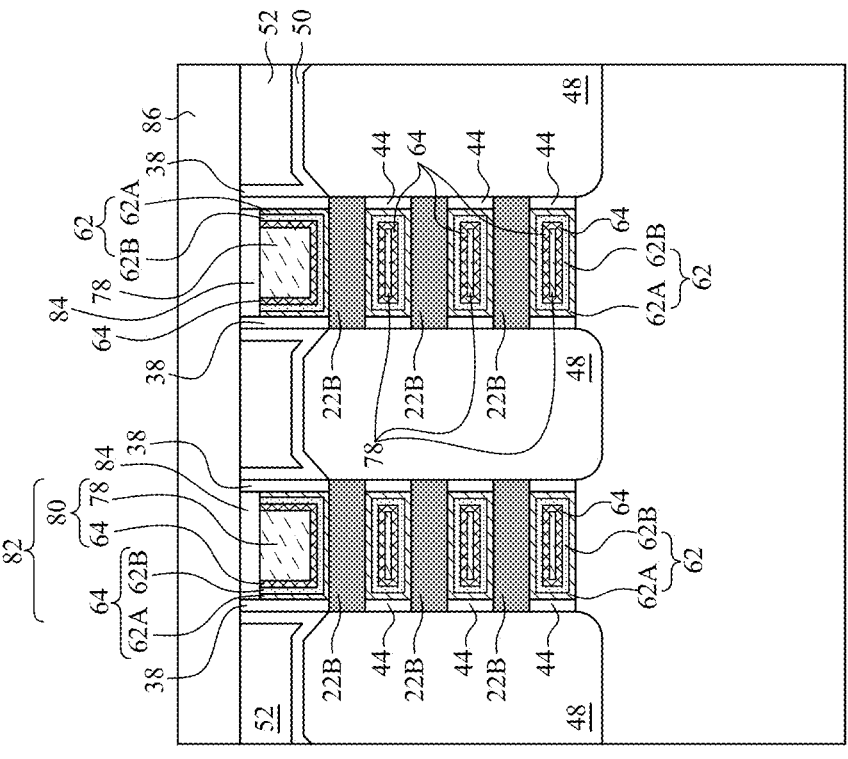
Figure 20A:
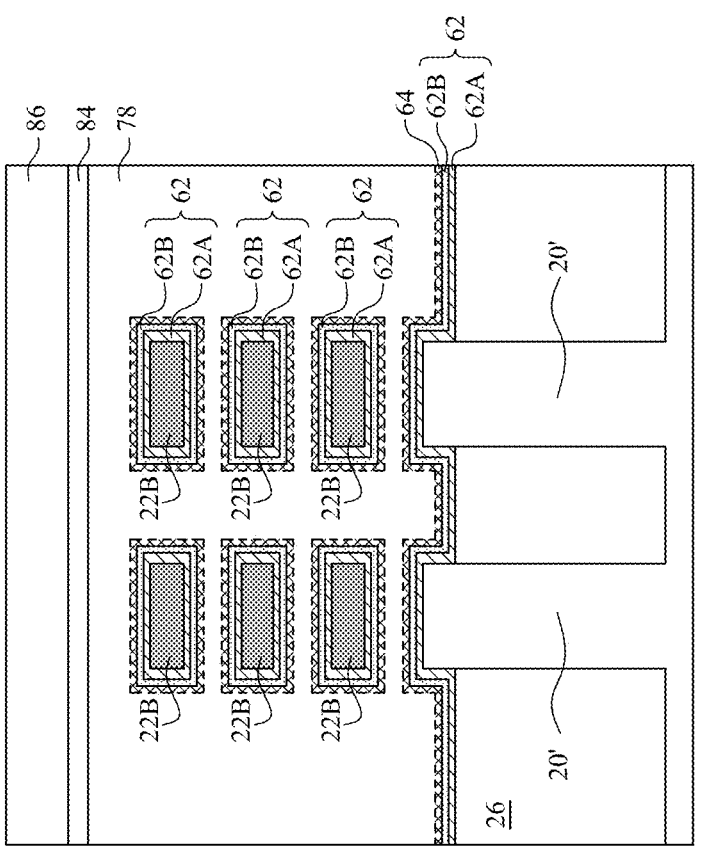

Next, as shown in FIGS. 20A and 20B, gate stacks 82 are recessed, so that recesses are formed directly over gate stacks 82 and between opposing portions of gate spacers 38. A gate mask 84 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 236 in the process flow 200 shown in FIG. 28.

As further illustrated by FIGS. 20A and 20B, ILD 86 is deposited over ILD 52 and over gate masks 84. The respective process is illustrated as process 238 in the process flow 200 shown in FIG. 28. An etch stop layer (not shown), may be, or may not be, deposited before the formation of ILD 86. In accordance with some embodiments, ILD 86 is formed through FCVD, CVD, PECVD, or the like. ILD 86 is formed of a dielectric material, which may be selected from silicon oxide, PSG, BSG, BPSG, USG, or the like.

Figure 21B:
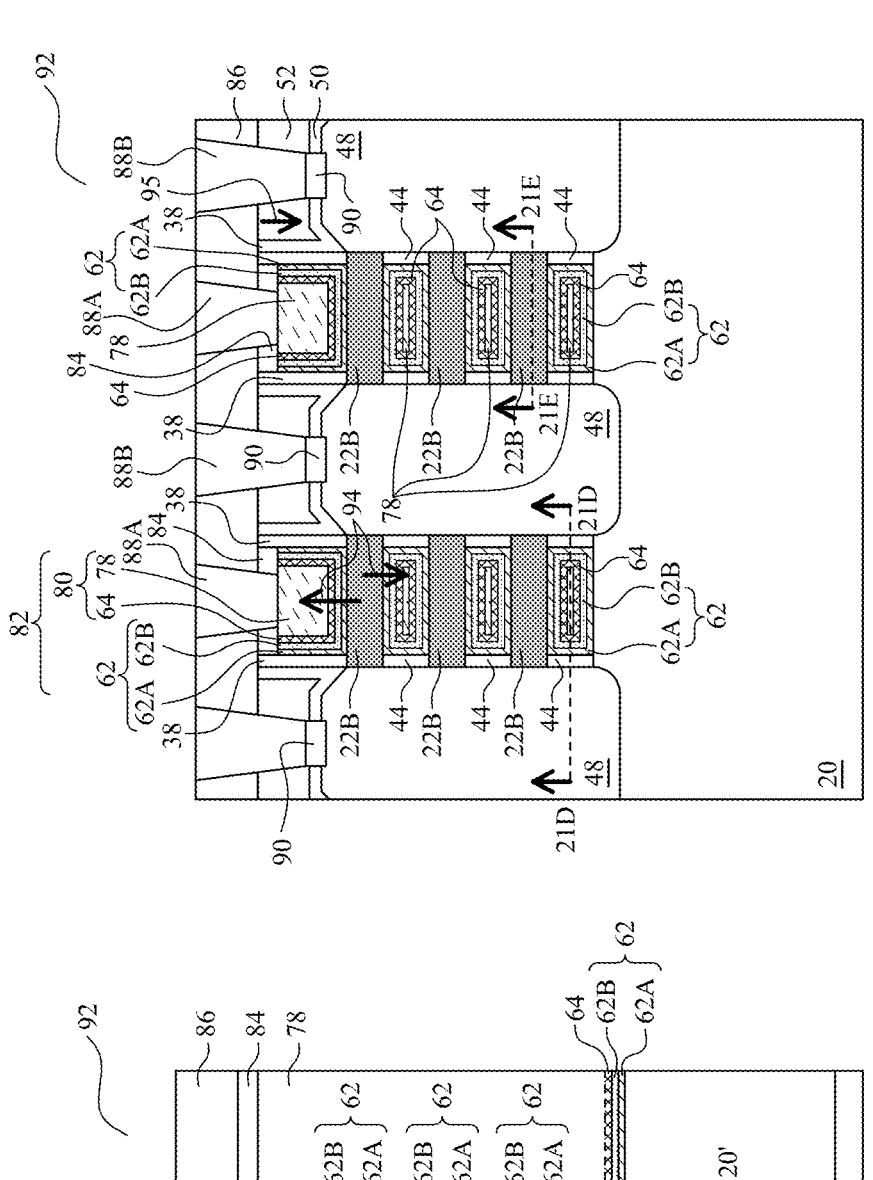
Figure 21A:
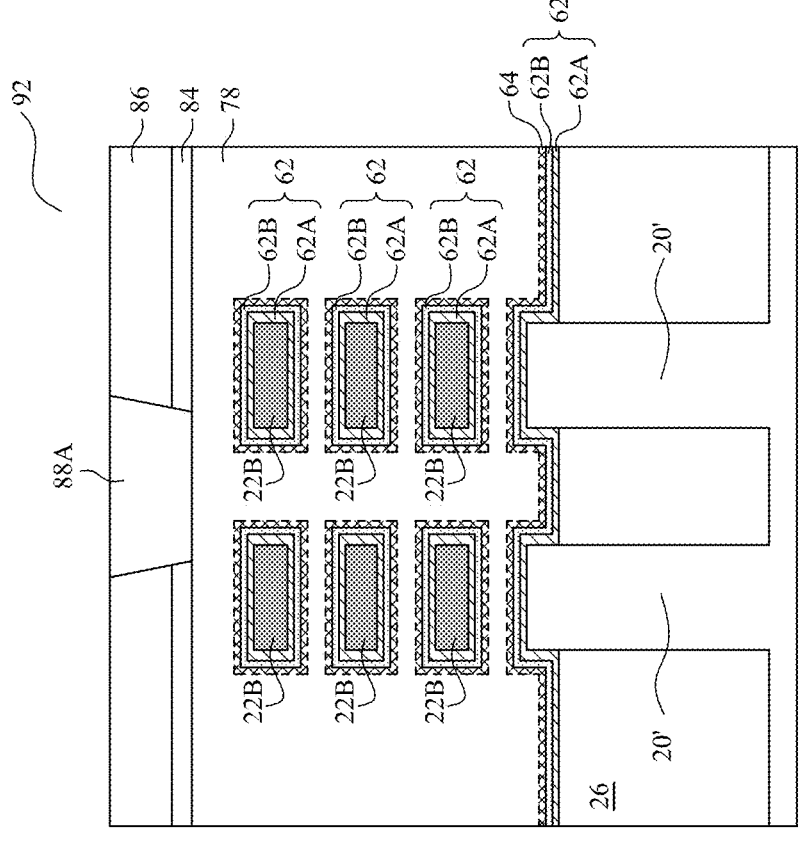

In FIGS. 21A and 21B, ILD 86, ILD 52, CESL 50, and gate masks 84 are etched to form recesses (occupied by contact plugs 88A and 88B) exposing surfaces of the epitaxial source/drain regions 48 and/or gate stacks 82. The recesses may be formed through etching using an anisotropic etching process.

After the recesses are formed, silicide regions 90 (FIG. 21B) are formed over the epitaxial source/drain regions 48. The respective process is illustrated as process 240 in the process flow 200 shown in FIG. 28. In accordance with some embodiments, silicide regions 90 are formed by first depositing a metal layer (not shown) capable of reacting with the semiconductor materials of the underlying epitaxial source/drain regions 48 (for example, silicon, silicon germanium, or germanium) to form silicide and/or germanide regions, then performing a thermal annealing process to form silicide regions 90. The metal may include nickel, cobalt, titanium, tantalum, platinum, tungsten, or the like. The un-reacted portions of the deposited metal are then removed, for example, through an etching process.

Contact plugs 88B are then formed over silicide regions 90. Also, contact plugs 88A (may also be referred to as gate contact plugs) are also formed in the recesses, and are over and contacting gate electrodes 80. The respective processes are illustrated as process 242 in the process flow 200 shown in FIG. 28. Although FIG. 21B illustrates that contact plugs 88A and 88B are in a same cross-section, in various embodiments, contact plugs 88A and 88B may be formed in different cross-sections, thereby reducing the risk of shorting with each other. GAA transistor 92 is thus formed.

FIG. 21C illustrates a perspective view of the structure shown in FIGS. 21A and 21B, wherein the cross-sectional views shown in FIGS. 21A and 21B are obtained from the cross-sections 21A-21A and 21B-21B, respectively, in FIG. 21C. FIGS. 21D and 21E illustrate the horizontal cross-sectional views of the structure shown in FIGS. 21A, 21B, and 21C, wherein the horizontal cross-sectional views are obtained from the horizontal planes 21D-21D and 21E-21E, respectively, in FIG. 21B.

Figure 26:
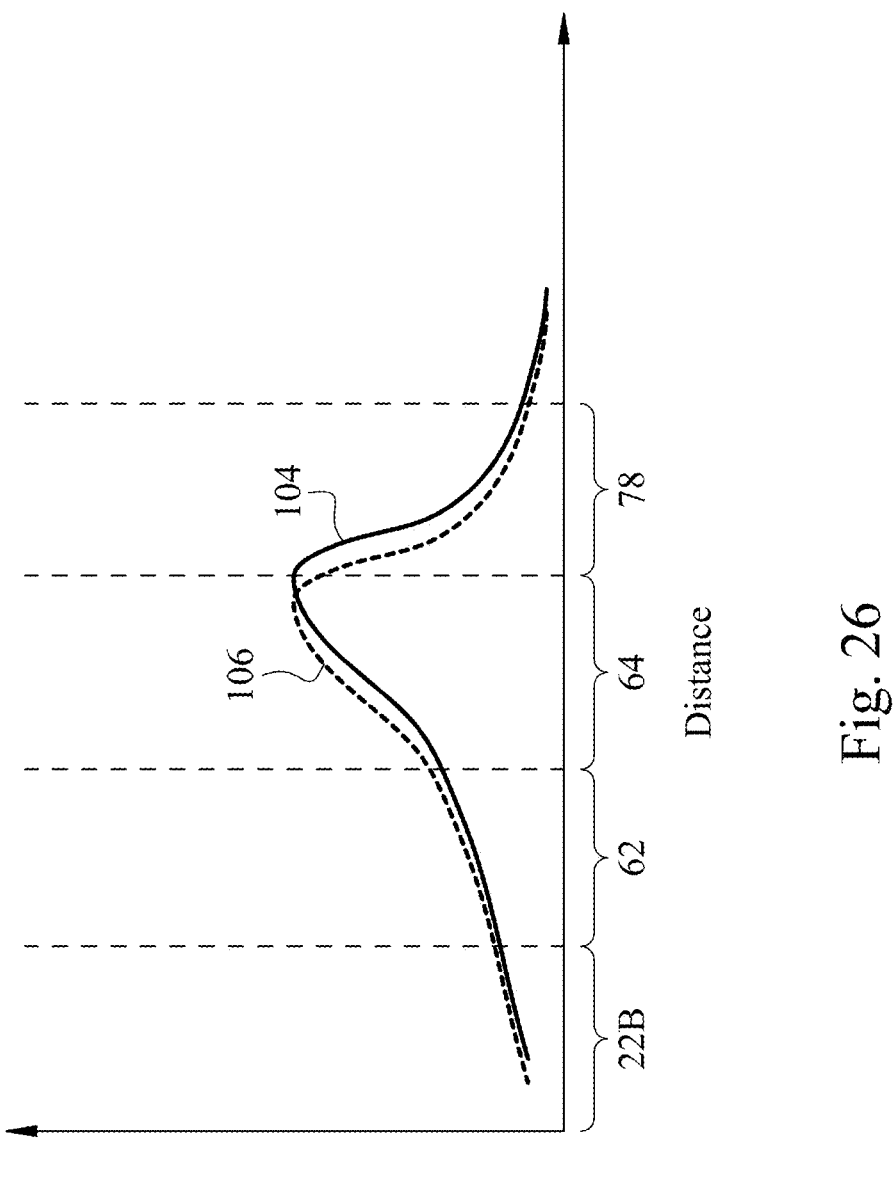
FIGS. 26-27 illustrate the distribution of the atomic percentages of fluorine in accordance with some embodiments.

FIG. 26 illustrates the fluorine atomic percentage in gate stacks 82 in accordance with some embodiments, wherein the X-axis represents the distance in the direction of arrows 94 in FIG. 21B. FIG. 26 corresponds to the embodiments in which work-function layer 64 is formed before fluorine-incorporation process 68 is performed. Since fluorine-containing layer 66 (FIGS. 16, 22 and 24) is removed, at a time before the conductive layers 78 are formed, the peak fluorine atomic percentage may be at the outer surface of work-function layer 64. Due to diffusion of fluorine into conductive layers 78, in the final transistor 92, the peak fluorine atomic percentage may be either in work-function layer 64, as shown by dashed line 106, or at the interface between work-function layer 64 and conductive layers 78, as shown by solid line 104. Furthermore, the fluorine atomic percentage in conductive layers 78 may be steeper than in work-function layer 64 and gate dielectric 62.

Figure 27:
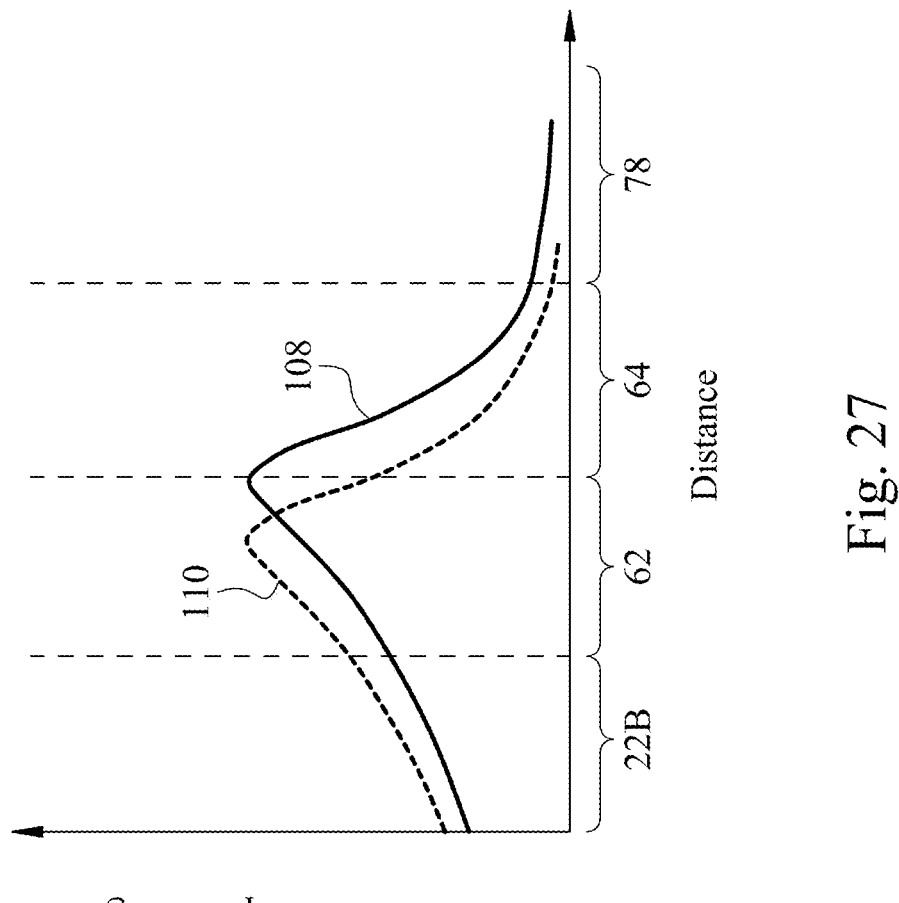

FIG. 27 illustrates the fluorine atomic percentage in gate stacks 82 in accordance with some embodiments, wherein the X-axis also represents the distance in the direction of arrows 94 in FIG. 21B. FIG. 27 corresponds to the embodiments in which work-function layer 64 is formed after the fluorine-incorporation process 68. Since fluorine-containing layer 66 (FIGS. 16, 22 and 24) is removed, at a time before the conductive layers 78 are formed, the peak fluorine atomic percentage may be at the outer surface of gate dielectric 62. Due to diffusion, in the final transistor 92, the peak fluorine atomic percentage may be in gate dielectric 62, as shown by dashed line 110, or at the interface between gate dielectric 62 and work-function layer 64, as shown as solid line 108. Furthermore, the fluorine atomic percentage in work-function layer 64 and conductive layers 78 may be steeper than in gate dielectric 62.

As appreciated from FIGS. 13B and 16 in combination, at the time fluorine-incorporation process 68 is performed, ILD 52 and gate spacers 38 have already been formed, and hence also have fluorine incorporated. The surfaces of ILD 52 and gate spacers 38 receiving fluorine has higher fluorine concentration than the deeper portions. For example, in the direction of arrow 95 in FIG. 21B, the fluorine concentration may be continuously reduced, similar to the profile of the left parts of the fluorine profile in FIGS. 26 and 27.

The embodiments of the present disclosure have some advantageous features. By incorporating fluorine into gate dielectrics, the defects in the high-k dielectric layer are fixed. Through cyclic fluorine-incorporation processes including the removal of fluorine-containing layers, the fluorine-containing layers are removed repeatedly, and the new fluorine-containing layers with higher fluorine concentrations are replenished. Accordingly, the fluorine-incorporation into the gate dielectrics is more efficient.

In accordance with some embodiments of the present disclosure, a method comprises removing a dummy gate stack to form a trench between gate spacers; depositing a gate dielectric extending into the trench; performing a first treatment process on the gate dielectric, wherein the first treatment process is performed using a fluorine-containing gas; performing a first drive-in process to drive fluorine in the fluorine-containing gas into the gate dielectric; performing a second treatment process on the gate dielectric, wherein the second treatment process is performed using the fluorine-containing gas; performing a second drive-in process to drive fluorine in the fluorine-containing gas into the gate dielectric; and after the second drive-in process, forming conductive layers to fill the trench. In an embodiment, the method further comprises, after the first drive-in process, removing a first fluorine-containing layer formed due to the first treatment process; and after the second drive-in process, removing a second fluorine-containing layer formed due to the second treatment process. In an embodiment, the method further comprises, after the second fluorine-containing layer is removed, performing a cleaning process to further remove residues of the first fluorine-containing layer and the second fluorine-containing layer. In an embodiment, the fluorine-containing gas comprises tungsten fluoride, and the first fluorine-containing layer and the second fluorine-containing layer further comprise tungsten therein.

In an embodiment, the fluorine-containing gas comprises nitrogen fluoride. In an embodiment, the method further comprises depositing a work-function layer on the gate dielectric, wherein the first treatment process and the second treatment process are performed on the work-function layer. In an embodiment, the method further comprises, after the first treatment process and the second treatment process, depositing a work-function layer on the gate dielectric. In an embodiment, the first drive-in process comprises an annealing process. In an embodiment, the method further comprises, after the second drive-in process, performing a third treatment process on the gate dielectric, wherein the third treatment process is performed using the fluorine-containing gas; and performing a third drive-in process to drive fluorine in the fluorine-containing gas into the gate dielectric.

In accordance with some embodiments of the present disclosure, a method comprises forming a dummy gate stack on a top surface and sidewalls of a multilayer stack, wherein the multilayer stack comprises a plurality of sacrificial layers and a plurality of nanostructures located alternatingly; removing the dummy gate stack to form a recess in a dielectric layer; removing the plurality of sacrificial layers; depositing gate dielectrics wrapping around the plurality of nanostructures; depositing work-function layers on the gate dielectrics; performing a plurality of cycles, wherein each of the plurality of cycles comprises forming a plurality of fluorine-containing layers, each on one of the gate dielectrics; driving-in fluorine in the plurality of fluorine-containing layers into the gate dielectrics; and removing the plurality of fluorine-containing layers; and after the plurality of cycles, forming a conductive layer, wherein the conductive layer comprises portions in gaps between the plurality of nanostructures.

In an embodiment, the forming the plurality of fluorine-containing layers comprises treating the gate dielectrics using $WF_6$ as a process gas. In an embodiment, the removing the plurality of fluorine-containing layers is performed using $NF_3$ as an etching gas. In an embodiment, in each of the plurality of cycles, the plurality of fluorine-containing layers formed before the driving-in is fully removed.

In an embodiment, the driving-in fluorine comprises an annealing process. In an embodiment, the forming the plurality of fluorine-containing layers is performed at a first wafer temperature, and the driving-in fluorine is performed at a second wafer temperature higher than the first wafer temperature. In an embodiment, the removing the plurality of fluorine-containing layers is performed through a dry etching process, and wherein the method further comprises, after the plurality of cycles, performing a wet etching process to etch residues of the plurality of fluorine-containing layers. In an embodiment, the plurality of cycles are performed on the work-function layers.

In accordance with some embodiments of the present disclosure, a method comprises forming a nanostructure in a trench, with gate spacers being on opposite sides of the trench; depositing a gate dielectric extending into the trench to encircle the nanostructure, wherein the gate dielectric comprises a high-k dielectric material; and after the gate dielectric is deposited, performing a plurality of cycles, wherein each of the plurality of cycles comprises performing a treatment process on the gate dielectric using $WF_6$ as a first process gas; and after the treatment process, performing an etching process using $NF_3$ as a second process gas. In an embodiment, the method further comprises a drive-in process in each of the plurality of cycles, wherein the drive-in process is performed after the treatment process and before the etching process. In an embodiment, the treatment process results in a tungsten-and-fluorine-containing layer being left on the gate dielectric, and wherein the etching process results in the tungsten-and-fluorine-containing layer to be etched.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
removing a dummy gate stack to form a trench between gate spacers;
depositing a gate dielectric extending into the trench;
depositing a work-function layer on the gate dielectric;
performing a first treatment process on the gate dielectric and the work-function layer, wherein the first treatment process is performed using a fluorine-containing gas;
performing a first drive-in process to drive fluorine in the fluorine-containing gas into the gate dielectric;
performing a second treatment process on the gate dielectric and the work-function layer, wherein the second treatment process is performed using the fluorine-containing gas;
performing a second drive-in process to drive fluorine in the fluorine-containing gas into the gate dielectric; and
after the second drive-in process, forming conductive layers to fill the trench.

2. The method of claim 1 further comprising:
after the first drive-in process, removing a first fluorine-containing layer formed due to the first treatment process; and after the second drive-in process, removing a second fluorine-containing layer formed due to the second treatment process.

3. The method of claim 2 further comprising, after the second fluorine-containing layer is removed, performing a cleaning process to further remove residues of the first fluorine-containing layer and the second fluorine-containing layer.

4. The method of claim 2, wherein the fluorine-containing gas comprises tungsten fluoride, and the first fluorine-containing layer and the second fluorine-containing layer further comprise tungsten therein.

5. The method of claim 1, wherein the fluorine-containing gas comprises nitrogen fluoride.

6. The method of claim 1, wherein the first drive-in process comprises an annealing process.

7. The method of claim 1 further comprising:
after the second drive-in process, performing a third treatment process on the gate dielectric, wherein the third treatment process is performed using the fluorine-containing gas; and
performing a third drive-in process to drive fluorine in the fluorine-containing gas into the gate dielectric.

8. The method of claim 2 further comprising:
depositing the first fluorine-containing layer before the first drive-in process; and
depositing the second fluorine-containing layer, wherein the removing the first fluorine-containing layer is performed before the second fluorine-containing layer is deposited.

9. The method of claim 8, wherein the first fluorine-containing layer and the second fluorine-containing layer comprise a same material.

10. A method comprising:
forming a dummy gate stack on a top surface and sidewalls of a multilayer stack, wherein the multilayer stack comprises a plurality of sacrificial layers and a plurality of nanostructures located alternatingly;
removing the dummy gate stack to form a recess in a dielectric layer;
removing the plurality of sacrificial layers;
depositing gate dielectrics wrapping around the plurality of nanostructures;
depositing work-function layers on the gate dielectrics;
performing a plurality of cycles, wherein each of the plurality of cycles comprises:
forming a plurality of fluorine-containing layers, each on one of the gate dielectrics;
driving-in fluorine in the plurality of fluorine-containing layers into the gate dielectrics; and
removing the plurality of fluorine-containing layers; and
after the plurality of cycles, forming a conductive layer, wherein the conductive layer comprises portions in gaps between the plurality of nanostructures.

11. The method of claim 10, wherein the forming the plurality of fluorine-containing layers comprises treating the gate dielectrics using $WF_6$ as a process gas.

12. The method of claim 11, wherein the removing the plurality of fluorine-containing layers is performed using $NF_3$ as an etching gas.

13. The method of claim 10, wherein in each of the plurality of cycles, the plurality of fluorine-containing layers formed before the driving-in is fully removed.

14. The method of claim 10, wherein the driving-in fluorine comprises an annealing process.

15. The method of claim 14, wherein the forming the plurality of fluorine-containing layers is performed at a first wafer temperature, and the driving-in fluorine is performed at a second wafer temperature different from the first wafer temperature.

16. The method of claim 10, wherein the removing the plurality of fluorine-containing layers is performed through a dry etching process, and wherein the method further comprises, after the plurality of cycles, performing a wet etching process to etch residues of the plurality of fluorine-containing layers.

17. The method of claim 10, wherein the plurality of cycles are performed on the work-function layers.

18. A method comprising:

forming a nanostructure in a trench, with gate spacers being on opposite sides of the trench;

depositing a gate dielectric extending into the trench to encircle the nanostructure, wherein the gate dielectric comprises a high-k dielectric material; and after the gate dielectric is deposited, performing a plurality of cycles, wherein each of the plurality of cycles comprises:

performing a treatment process on the gate dielectric using $WF_6$ as a first process gas; and after the treatment process, performing an etching process using $NF_3$ as a second process gas.

19. The method of claim 18 further comprising a drive-in process in each of the plurality of cycles, wherein the drive-in process is performed after the treatment process and before the etching process.

20. The method of claim 18, wherein the treatment process results in a tungsten-and-fluorine-containing layer being left on the gate dielectric, and wherein the etching process results in the tungsten-and-fluorine-containing layer to be etched.

\* \* \* \* \*